(12) United States Patent
O'Mahony et al.

(10) Patent No.: US 10,140,008 B2
(45) Date of Patent: Nov. 27, 2018

(54) MECHANICAL RATCHET SYSTEM FOR A KNOB

(71) Applicant: Logitech Europe S.A., Lausanne (CH)

(72) Inventors: Davin O'Mahony, Dublin (IE); Padraig Mcloughlin, County Monogham (IE); Baptiste Merminod, Dommartin (CH); Antoine Merminod, Gimel (CH)

(73) Assignee: Logitech Europe S.A., Lausanne (CH)

( * ) Notice: Subject to any disclaimer, the term of this patent is extended or adjusted under 35 U.S.C. 154(b) by 92 days.

(21) Appl. No.: 15/466,556

(22) Filed: Mar. 22, 2017

(65) Prior Publication Data

US 2018/0164901 A1   Jun. 14, 2018

Related U.S. Application Data

(60) Provisional application No. 62/433,187, filed on Dec. 12, 2016.

(51) Int. Cl.

| | |
|---|---|
| *G06F 3/0484* | (2013.01) |
| *G06F 3/0482* | (2013.01) |
| *G06F 3/0362* | (2013.01) |
| *G06F 3/02* | (2006.01) |
| *G06F 3/038* | (2013.01) |
| *G05G 1/10* | (2006.01) |
| *G05G 5/03* | (2008.04) |
| *H01H 19/14* | (2006.01) |
| *H03K 17/96* | (2006.01) |
| *G06F 3/041* | (2006.01) |

(52) U.S. Cl.
CPC .......... *G06F 3/04847* (2013.01); *G05G 1/10* (2013.01); *G05G 5/03* (2013.01); *G06F 3/02* (2013.01); *G06F 3/0213* (2013.01); *G06F 3/038* (2013.01); *G06F 3/0362* (2013.01); *G06F 3/0482* (2013.01); *H01H 19/14* (2013.01); *H03K 17/96* (2013.01); *G06F 3/041* (2013.01); *G06F 2203/04104* (2013.01); *H01H 2235/01* (2013.01)

(58) Field of Classification Search
CPC ...... G06F 3/04847; G06F 3/02; G06F 3/0213; G06F 3/0362; G06F 3/038; G06F 3/0482; G06F 3/041; G06F 2203/04104; G05G 5/03; G05G 1/10; H01H 19/14; H01H 2235/01; H03K 17/96
See application file for complete search history.

(56) References Cited

U.S. PATENT DOCUMENTS

2006/0012584 A1* 1/2006 Vassallo ............... G06F 3/016
345/184

* cited by examiner

*Primary Examiner* — Sahlu Okebato
(74) *Attorney, Agent, or Firm* — Kilpatrick Townsend & Stockton LLP

(57) ABSTRACT

A knob for an input device may include a knob housing being rotatable on an axis, a shaft coupled to and extending from the knob housing along the axis, a ratchet wheel axially coupled to the shaft and including a toothed perimeter, and a resistance wheel axially coupled to the shaft and including a smooth perimeter, where the ratchet wheel and the resistance wheel are rotatable on the axis in correspondence with a rotation of the knob housing. A biasing mechanism provides a force on its first end to cause a roller to engage with the toothed perimeter of the ratchet wheel such that a ratcheted rotation occurs when the knob housing is rotated, and further provides a force on its second end to cause the second end to engage with the smooth perimeter of the resistance wheel such that a friction is provided when the knob housing is rotated.

20 Claims, 17 Drawing Sheets

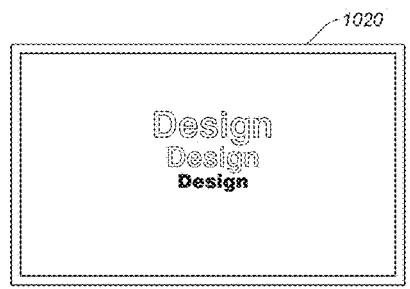
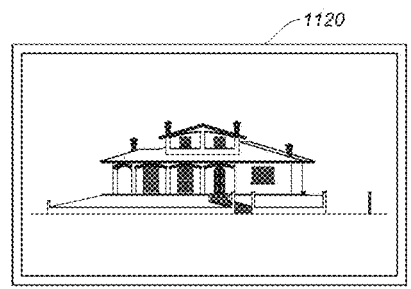
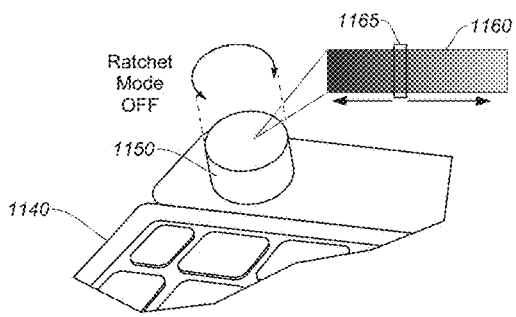
FIG. 10　　　　　　　FIG. 11

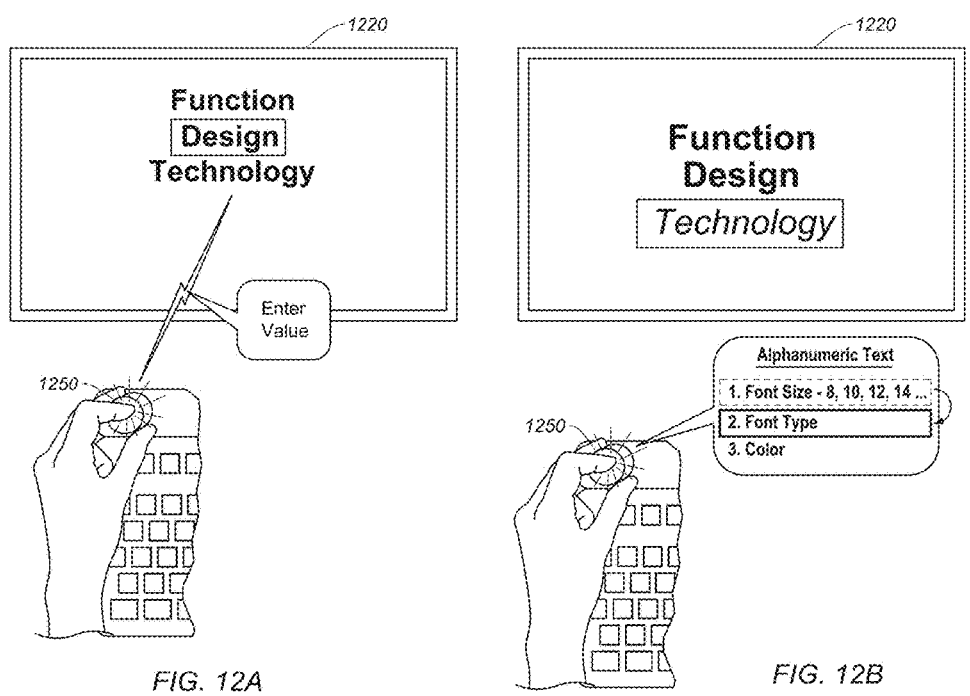

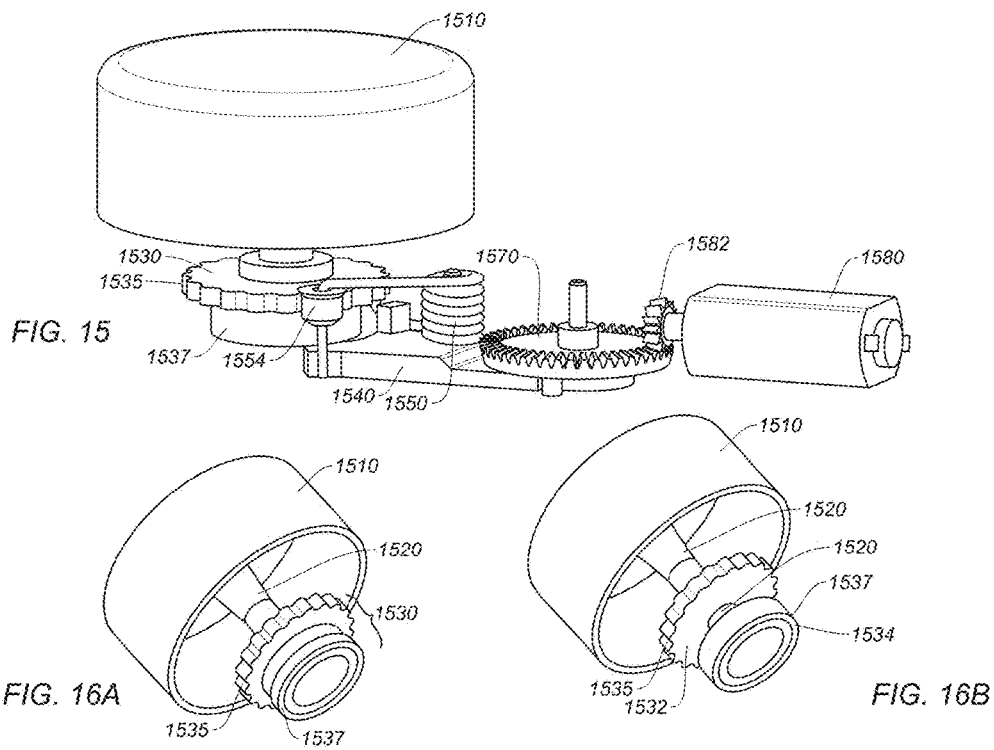

MECHANICAL RATCHET SYSTEM FOR A KNOB

CROSS-REFERENCES TO RELATED APPLICATIONS

This application is a non-provisional application and claims the benefit and priority of U.S. Provisional Application No. 62/433,187, filed on Dec. 12, 2016, and titled "CONTEXTUALLY-BASED FUNCTIONAL ASSIGNMENT FOR A USER-MANIPULABLE ELEMENT ON AN INPUT DEVICE," which is hereby incorporated by reference in its entirety for all purposes.

BACKGROUND

Peripheral devices generally include any auxiliary device that can be used to interface human and computer. Some common peripheral devices include keyboards, computer mice, image scanners, speakers, microphones, web cameras, and more.

Keyboards and computer mice, in particular, have improved in function and performance over the last few decades to increase user productivity. For instance, the advent of function keys, key pads, programmable hot keys, scroll wheels, and the like, have helped users become more efficient by placing commonly used functions in quickly accessible locations. However, despite these improvements, more powerful, feature-laden software (e.g., Photoshop®) still requires users to navigate cumbersome and sometimes non-intuitive interfaces with nested menus and windows that still can make for highly inefficient work-sessions, especially for software users that are not highly experienced or steeped in the particular software. New developments are needed to improve the user interface, streamline workflow, and increase work efficiencies across a broad spectrum of applications.

BRIEF SUMMARY

In certain embodiments, a knob for an input device includes a knob housing being rotatable on an axis, a shaft coupled to and extending from the knob housing along the axis, a ratchet wheel axially coupled to the shaft and including a toothed perimeter, and a resistance wheel axially coupled to the shaft and including a smooth perimeter, where the ratchet wheel and the resistance wheel are rotatable on the axis in correspondence with a rotation of the knob housing. The knob can further have a biasing mechanism (e.g., helicoidal spring, torsion spring, etc.) including a first end coupled to a roller, where the biasing mechanism provides a first force causing the roller on the first end to engage with the toothed perimeter of the ratchet wheel such that a ratcheted rotation occurs when the knob housing is rotated, and a second end, where the biasing mechanism provides a second force causing the second end to engage with the smooth perimeter of the resistance wheel such that a friction is provided when the knob housing is rotated. In some cases, the first and second forces provided by the biasing mechanism can be adjustable and controlled by a processor. In some embodiments, the first force causing the roller on the first end to engage with the toothed perimeter of the ratchet wheel can be adjustable by the processor to vary an intensity of the ratcheted rotation, and the second force causing the second end to engage with the resistance wheel can be adjustable by the processor to vary an intensity of the friction.

In some embodiments, the knob can further include a lever coupled to the biasing mechanism, the lever to switch between a first position and a second position, where when in the first position, the lever causes the second end of the biasing mechanism to disengage with the resistance wheel, and where when in the second position, the lever causes the roller on the first end of the biasing mechanism to disengage with the ratchet wheel. Some implementations include a gear system coupled to the lever, a processor, and an electric motor controlled by the processor and coupled to the gear system to cause the lever to switch between the first position and the second position. The gear system can include a protrusion that stops the lever from rotating past the first position and the second position. In some cases, the knob can include a switch disposed below and substantially in axial alignment with the shaft, where the knob is depressible, and where the switch can be activated when the knob is depressed. The toothed perimeter of the ratchet wheel can include a low friction material, and the smooth perimeter of the resistance wheel may include a high friction material. In some cases, the ratchet wheel and the resistance wheel can share a common body.

In further embodiments, a computer-implemented method for the operation of a knob on an input device includes receiving input data, by a processor, corresponding to a selection of one of a ratchet-mode of operation for the knob and a resistance-mode of operation for the knob. In some cases, when the input data corresponds to the selection of the resistance-mode of operation, the method can include controlling, by the processor, a first end of a biasing mechanism (e.g., helicoidal spring, torsion spring, etc.) to disengage with a toothed perimeter of a wheel that is axially coupled to a shaft extending from the knob, and controlling, by the processor, a second end of the biasing mechanism to engage with a smooth perimeter of the wheel to provide a frictional resistance to rotation when the knob is rotated. In some embodiments, when the input data corresponds to the selection of the ratchet-mode of operation, the method can include controlling, by the processor, the first end of a biasing mechanism to engage with the toothed perimeter of the wheel to provide a ratcheted rotation when the knob is rotated, and controlling, by the processor, the second end of the biasing mechanism to disengage with the smooth perimeter of the wheel.

In some embodiments, a lever can control the first end and second end of the biasing mechanism, and the method can further include when the input data corresponds to the selection of the resistance-mode of operation, moving the lever to a first position to cause the second end of the biasing mechanism to disengage with the smooth perimeter of the wheel, and when the input data corresponds to the selection of the ratchet-mode of operation, moving the lever to a second position to cause the first end of the biasing mechanism to disengage with the toothed perimeter of the wheel. In some cases, an electric motor can control the moving the lever to the first position and the moving the lever to the second position. In some cases, the toothed perimeter of the wheel can include a low friction material, and the smooth perimeter of the wheel can include a high friction material. In certain embodiments, the toothed perimeter and the smooth perimeter can be on separate wheels and separated by the shaft, or they may share a common body.

In further embodiments, the input data further can include intensity data, where when the input data corresponds to the ratchet-mode of operation, the method can include modifying an intensity of the ratcheted rotation based on the intensity data, and where when the input data corresponds to the resistance-mode of operation, the method can include modifying an intensity of the frictional resistance to rotation based on the intensity data.

In some embodiments, an apparatus includes a knob housing being rotatable on an axis, a shaft coupled to and extending from the knob housing along the axis, a wheel axially coupled to the shaft and including a toothed perimeter and a smooth perimeter, where the wheel can be rotatable on the axis in correspondence with a rotation of the knob housing. The apparatus can further include a wheel contacting interface including a first end and a second end, where the first end is coupled to a roller. The apparatus may include a lever coupled to the wheel contacting interface, the lever to switch between a first position and a second position, where when in the first position, the lever can cause the roller on the first end to engage with the toothed perimeter of the wheel such that a ratcheted rotation occurs when the knob housing is rotated, and where when in the second position, the lever can cause the second end to engage with the smooth perimeter of the wheel such that a friction is provided when the knob housing is rotated.

In some embodiments, the apparatus can further include a gear system coupled to the lever, a processor, and an electric motor controlled by the processor and coupled to the gear system to cause the lever to switch between the first position and the second position. Certain embodiments can include an actuator disposed below and substantially in axial alignment with the shaft, where the knob can be depressible, and the actuator can activated when the knob is depressed.

BRIEF DESCRIPTION OF THE DRAWINGS

The detailed description is set forth with reference to the accompanying figures.

FIG. 10 shows aspects of associating a function with a user-manipulable object on an input device, according to certain embodiments.

FIG. 11 shows aspects of associating a function with a user-manipulable object on an input device, according to certain embodiments.

FIG. 12A shows aspects of associating a function with a user-manipulable object on an input device, according to certain embodiments.

FIG. 12B shows aspects of associating a function with a user-manipulable object on an input device, according to certain embodiments.

FIG. 15 shows a simplified example of a mechanical ratchet system for a knob, according to certain embodiments.

FIG. 16A shows aspects of a knob assembly for a mechanical ratchet system, according to certain embodiments.

FIG. 16B shows aspects of an alternative knob assembly for mechanical ratchet system, according to certain embodiments.

DETAILED DESCRIPTION

Figure 1:
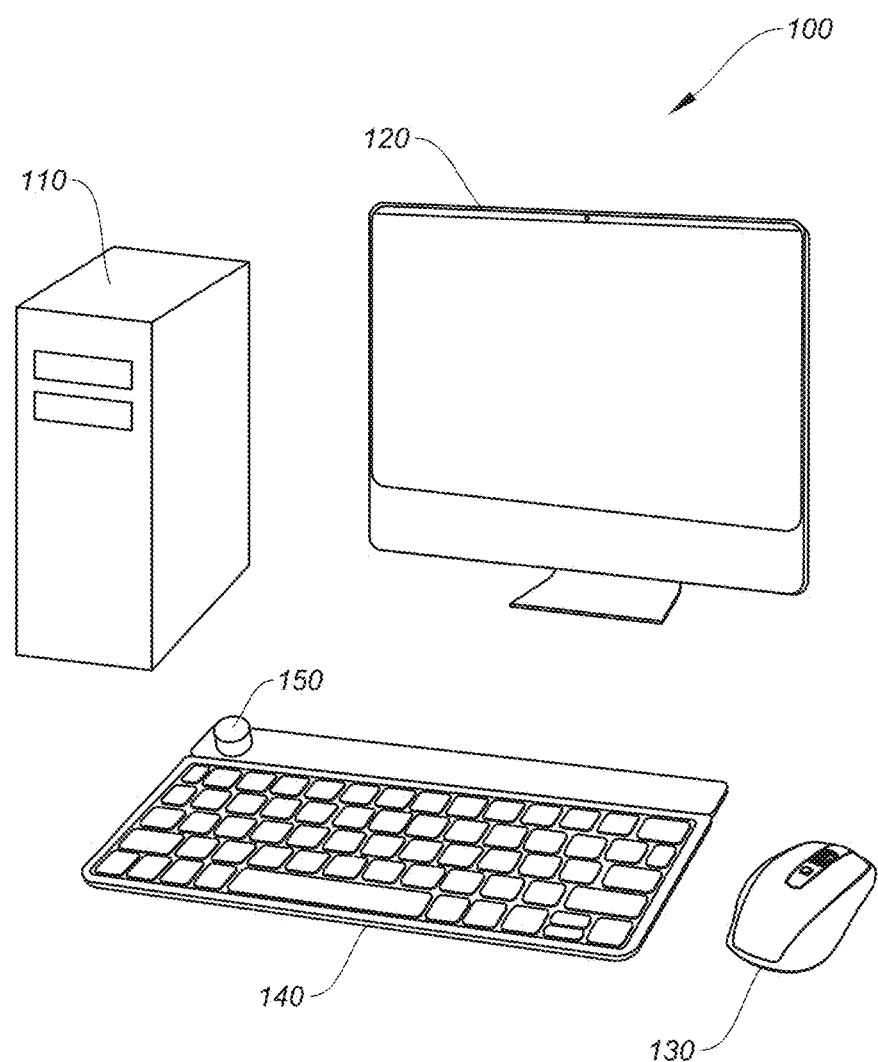
FIG. 1 shows a typical implementation for a system utilizing a contextually-based functional assignment for a user-manipulable element on an input device, according to certain embodiments.

Aspects of the present disclosure relate generally to input devices, and in particular to a mechanical ratchet system, according to certain embodiments.

In the following description, various embodiments of a mechanical ratchet system will be described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

Conceptual Overview of Certain Embodiments

Some embodiments of the invention relate to a user-manipulable element (e.g., a knob) disposed on an input device (e.g., keyboard) that can be assigned a function based on a contextual interaction on a graphical user interface (GUI). More specifically, the input device may include a user-manipulable knob (see, e.g., element 150 of FIG. 1), a ratchet system disposed in the knob to apply a ratcheted or non-ratcheted mode, and one or more touch-sensitive sensors ("touch sensor(s)") disposed on a surface of the knob. An operational configuration can be applied to the knob which may control one or more aspects of knob rotation, knob rotation resolution, knob rotation resistance (e.g., torque friction), knob ratchet/no-ratchet modes, touch-based functions, and the like, as further discussed below. The operational configuration can be based on a contextual usage of the input device. For example, selecting alphanumeric text on a display may cause the knob to control functions associated with alphanumeric text, such as font size, font type, font color, font position, and the like, as further discussed below.

The input device can be connected to and/or controlled by a host computing device. For instance, one or more processors of the host computing device can detect a selectable control element on a GUI (e.g., alphanumeric text), determine an editable parameter (e.g., font size) associated with the selectable control element, and associate a control of the editable parameter with a user-manipulable element on an input device. The one or more processors can further generate and send control data causing the input device (e.g., a processor of the input device) to assign a performance characteristic to the knob based on properties of the editable parameter. As discussed above, the performance characteristic may include a rotation resistance of the knob, a rotational input resolution of the knob (e.g., rotation sensitivity), a setting of a ratchet or non-ratchet mode of operation to the knob based on the properties of the editable parameter, a function of one or more touch sensors on the knob, or a depressible function (e.g., button press). In some aspects, the control data can control an electro-magnetic actuator (e.g., clutch) in the control knob to set the ratchet mode and non-ratchet mode of operation. In certain embodiments, touching the touch sensor(s) (e.g., input data) may cause the touch sensor to enter a value that is selected by rotating the knob, similar to how an "enter" key on a keyboard may enter data typed into a data field. In some cases, touching the touch sensor(s) may cause the knob to switch a control of a first editable parameter associated with the selectable control element to a second selectable control element in response to receiving the input data.

In some embodiments, a mechanical ratchet system for a knob is provided. The knob can be a standalone unit or may be incorporated into an input device (e.g., keyboard, computer mouse, remote control, game controller, etc.). The knob can include a knob housing that is rotatable on an axis. A shaft can be coupled to the knob housing and extend therefrom along the axis. A ratchet wheel, having a toothed perimeter, and a resistance wheel, having a smooth perimeter, can be axially coupled to the shaft and rotatable on the axis in correspondence with a rotation of the knob housing. The knob can include a biasing mechanism (e.g., a spring) having a first end coupled to a roller, where the biasing mechanism provides a first force causing the roller on the first end to engage with the toothed perimeter of the ratchet wheel such that a ratcheted rotation occurs when the knob housing is rotated, and a second end, where the biasing mechanism provides a second force causing the second end to engage with the smooth perimeter of the resistance wheel such that a friction is provided when the knob housing is rotated. A lever may be coupled to the biasing mechanism to switch between a first position and a second position, where when in the first position, the lever may cause the second end of the biasing mechanism to disengage with the resistance wheel, and where when in the second position, the lever may cause the roller on the first end of the biasing mechanism to disengage with the ratchet wheel. The lever can be controlled by a processor-controlled electric motor to cause the lever to switch between the first and second positions via a gear system to couple the motor and lever. Various embodiments of the mechanical ratchet system are further discussed below with respect to FIGS. 14-24.

Typical System Environment for Certain Embodiments

FIG. 1 shows a typical implementation for a system 100 utilizing a contextually-based functional assignment for a user-manipulable element 150 on an input device 140, according to certain embodiments. System 100 may include computer 110, display 120, input device 130 (e.g., "computer mouse 130"), and input device 140 (e.g., "keyboard 140"). Keyboard 140 can include a user-manipulable element 150 ("knob 150"). For system 100, input device 130 and keyboard 140 can be configured to control aspects of computer 110 and display 120, as would be understood by one of ordinary skill in the art. Computer 110 can be referred to as a "host computer" or a "host computing device."

Computer 110 may include a machine readable medium (not shown) that is configured to store computer code, such as keyboard driver software, and the like, where the computer code is executable by a processor (e.g., processor(s) 302) of computer 110 to affect control of computer 110 by input devices 130 and/or 140. The various embodiments described herein generally refer to input device 140 as a keyboard or similar input device, however it should be understood that input device 140 can be any input/output (I/O) device, user interface device, control device, input unit, or the like.

The user-manipulable element is typically described as a knob throughout this disclosure, however it should be understood that any suitable user-manipulable element can be used, such as a button, scroll wheel, trackball, joystick, slider, or the like, as would be understood by one of ordinary skill in the art. A "knob," as described herein, can be interchangeably referred to as a "dial" or "crown."

Input device 140 is typically described as a keyboard throughout this disclosure, however it should be understand that any suitable input device that can include a user-manipulable object, as described herein, can be used including, but not limited to, a computer mouse, a remote control device, a wearable device (e.g., smart watch, wristband, glasses), a smart phone, or the like.

The host computing device is typically described as a desktop or laptop computing device. However, it should be understood that the host computing device can be any suitable computing device further including a tablet computer, a smart phone, a virtual or augmented reality interface (e.g., having 2D or 3D displays), a holographic interface, or the like. One of ordinary skill in the art would understand the many variations, modifications, and alternative embodiments thereof.

Figure 2:
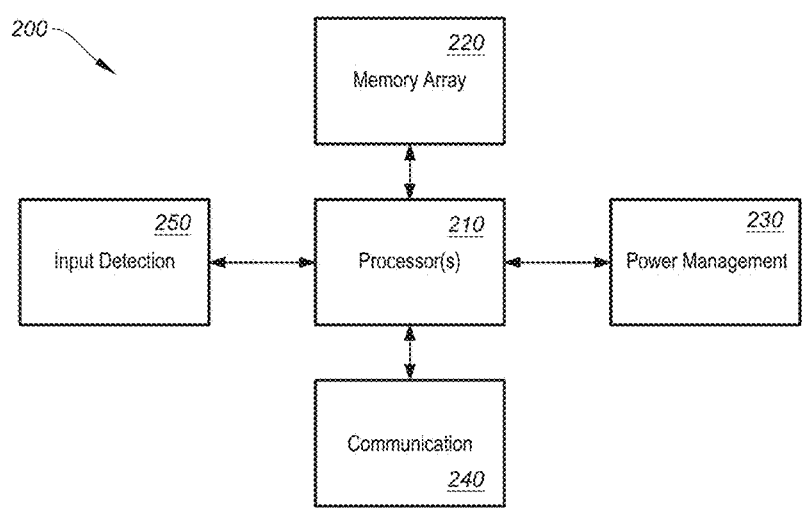
FIG. 2 shows a system for operating an input device, according to certain embodiments.

FIG. 2 shows a system for operating an input device 140, according to certain embodiments. System 200 includes processor(s) 210, memory array 220, power management system 230, communication system 240, and input detection module 250. Each of the system blocks 220-250 can be in electrical communication with the processor(s) 210 (e.g., via a bus system). System 200 may further include additional systems that are not shown or discussed to prevent obfuscation of the novel features described herein. System blocks 220-250 may be implemented as separate modules, or alternatively, more than one system block may be implemented in a single module. In the context described herein, input device 140 can be a keyboard with knob 150, as described above with respect to FIG. 1.

In certain embodiments, processor(s) 210 comprises one or more microprocessors (μCs) and can be configured to control the operation of system 200. Alternatively, processor(s) 210 may include one or more microcontrollers (MCUs), digital signal processors (DSPs), or the like, with supporting hardware and/or firmware (e.g., memory, programmable I/Os, etc.), as would be appreciated by one of ordinary skill in the art. Processor(s) 210 can control some or all aspects of operation of input device 140 (e.g., system block 220-250). Alternatively or additionally, some of system blocks 220-250 may include an additional dedicated processor, which may work in conjunction with processor 210. One of ordinary skill in the art would understand the many variations, modifications, and alternative embodiments thereof.

Memory array 220 may be configured to store information pertaining to one or more operational configurations of input device 140. As further discussed below, one or more operational configurations of input device 140 may include setting performance characteristics of knob 150, including but not limited to, a rotation resistance of the knob, a rotational input resolution of the knob (e.g., rotation sensitivity), setting a ratchet or non-ratchet mode of operation to the knob based on the properties of the editable parameter, a function of a depressible knob, a sensitivity of one or more touch sensors on knob 150, functions associated with multiple detected touches on knob 150 (by the touch sensors), their corresponding locations, and the like, as further discussed below.

Memory array 220 can further include stored input values associated with corresponding keys of keyboard 140, as would be understood by one of ordinary skill in the art. Additionally, memory array 220 can store one or more software programs to be executed by processors (e.g., in processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read-only memory (ROM) and/or applications stored in media storage that can be read into memory for processing by processing devices. Software can be implemented as a single program or a collection of separate programs and can be stored in non-volatile storage and copied in whole or in-part to volatile working memory during program execution.

Power management system 230 can be configured to manage power distribution, recharging, power efficiency, and the like, for input device 140. In some embodiments, power management system 230 can include a battery (not shown), a USB based recharging system for the battery (not shown), and power management devices (e.g., low-dropout voltage regulators—not shown). In certain embodiments, the functions provided by power management system 230 may be incorporated into processor(s) 210. The power source can be a replaceable battery, a rechargeable energy storage device (e.g., super capacitor, Lithium Polymer Battery, NiMH NiCd), or a corded power supply. The recharging system can be an additional cable (specific for the recharging purpose) or it can use a USB connection to recharge the battery.

Communications system 240 can be configured to provide wireless communication with computer 110, or other devices and/or peripherals, according to certain embodiments. Communications system 240 can be configured to provide radio-frequency (RF), Bluetooth®, infra-red (IR), ZigBee®, or other suitable communication technology to communicate with other computing devices and/or peripheral devices. System 200 may optionally comprise a hardwired connection to computer 110. For example, keyboard 140 can be configured to receive a Universal Serial Bus (USB) cable to enable bi-directional electronic communication with computer 110 or other external devices. Some embodiments may utilize different types of cables or connection protocol standards to establish hardwired communication with other entities.

Input detection module 250 can control the detection of a user-interaction with input elements on input device 140. For instance, input detection module 250 can detect user inputs on knob 150, key presses on the various keys of input device 140 (e.g., QWERTY keys, function keys, number pad keys, etc.), or other suitable input elements or device such as a media control button, voice-over-internet-protocol (VoIP) button, touch sensors (e.g., touch pads) and the like. In some embodiments, input detection module 250 can work in conjunction with memory array 220 to detect inputs on input device 140 and associate various functions with each input element (e.g., knob 150).

Although certain systems may not expressly discussed, they should be considered as part of system 200, as would be understood by one of ordinary skill in the art. For example, system 200 may include a bus system to transfer power and/or data to and from the different systems therein.

It should be appreciated that system 200 is illustrative and that variations and modifications are possible. System 200 can have other capabilities not specifically described herein. Further, while system 200 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained.

Embodiments of the present invention can be realized in a variety of apparatuses including electronic devices implemented using any combination of circuitry and software. Furthermore, aspects and/or portions of system 200 may be combined with or operated by other sub-systems as required by design. For example, input detection module 250 and/or memory array 220 may operate within processor(s) 210 instead of functioning as a separate entity. In addition, the inventive concepts described herein can also be applied to a mouse, keypad, or other similar input device. For instance, aspects of system 200 can be applied to a computer mouse, including knob 150. Further, system 200 can be applied to any of the input devices described in the embodiments herein, whether explicitly, referentially, or tacitly described (e.g., would have been known to be applicable to a particular input device by one of ordinary skill in the art). The foregoing embodiments are not intended to be limiting and those of ordinary skill in the art with the benefit of this disclosure would appreciate the myriad applications and possibilities.

Figure 3:
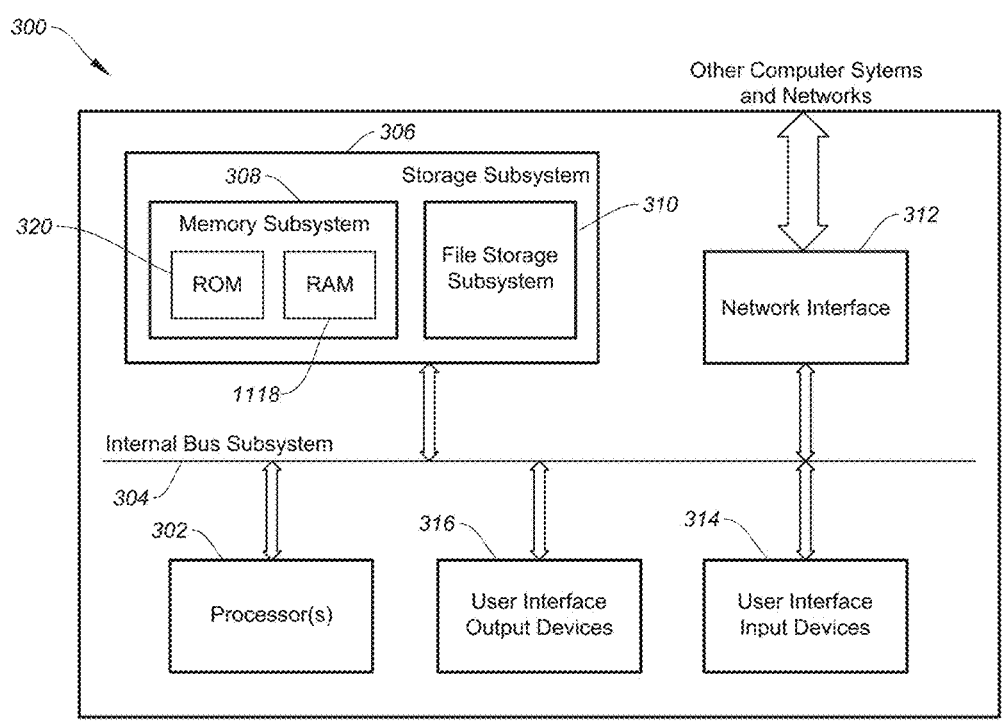
FIG. 3 shows a system for operating a host computing device, according to certain embodiments.

FIG. 3 shows a system 300 for operating a host computing device (e.g., host computing device 110), according to certain embodiments. System 300 can be used to implement any of the host computing devices discussed herein with respect to FIGS. 1 and 4-13 and the myriad embodiments defined herein or within the purview of this disclosure but not necessarily explicitly described. System 300 can include one or more processors 302 that can communicate with a number of peripheral devices (e.g., input devices) via a bus subsystem 304. These peripheral devices can include storage subsystem 306 (comprising memory subsystem 308 and file storage subsystem 310), user interface input devices 314, user interface output devices 316, and network interface subsystem 312. User input devices 314 can be any of the input device types described herein (e.g., keyboard, computer mouse, remote control, etc.). User output devices 316 can be a display of any type, including computer monitors, displays on handheld devices (e.g., smart phones, gaming systems), or the like, as would be understood by one of ordinary skill in the art. Alternatively or additionally, a display may include virtual reality (VR) displays, augmented reality displays, holographic displays, and the like, as would be understood by one of ordinary skill in the art.

In some examples, internal bus subsystem 304 can provide a mechanism for letting the various components and subsystems of computer system 300 communicate with each other as intended. Although internal bus subsystem 304 is shown schematically as a single bus, alternative embodiments of the bus subsystem can utilize multiple buses. Additionally, network interface subsystem 312 can serve as an interface for communicating data between computer system 300 and other computer systems or networks. Embodiments of network interface subsystem 312 can include wired interfaces (e.g., Ethernet, CAN, RS232, RS485, etc.) or wireless interfaces (e.g., Bluetooth®, BLE, ZigBee®, Z-Wire®, Wi-Fi, cellular protocols, etc.).

In some cases, user interface input devices 314 can include a keyboard (keyboard 140), a presenter, a pointing device (e.g., mouse, trackball, touchpad, etc.), a touchscreen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computer system 300. Additionally, user interface output devices 316 can include a display subsystem, a printer, or non-visual displays such as audio output devices, etc. The display subsystem can be any known type of display device. In general, use of the term "output device" is intended to include all possible types of devices and mechanisms for outputting information from computer system 300.

Storage subsystem 306 can include memory subsystem 308 and file storage subsystem 310. Memory subsystems 308 and file storage subsystem 310 represent non-transitory computer-readable storage media that can store program code and/or data that provide the functionality of embodiments of the present disclosure. In some embodiments, memory subsystem 308 can include a number of memories including main random access memory (RAM) 318 for storage of instructions and data during program execution and read-only memory (ROM) 320 in which fixed instructions may be stored. File storage subsystem 310 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 300 is illustrative and not intended to limit embodiments of the present disclosure. Many other configurations having more or fewer components than system 300 are possible. The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard or non-standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server(s) may also include database servers, including without limitation those commercially available from Oracle®, Microsoft®, Sybase® and IBM®.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. F or example, customized hardware might also be used and/or particular elements might be implemented in hardware, software (including portable software, such as applets) or both. Further, connections to other computing devices such as network input/output devices may be employed.

Aspects of the Use and Configuration of the User-Manipulable Element

Figure 4A:
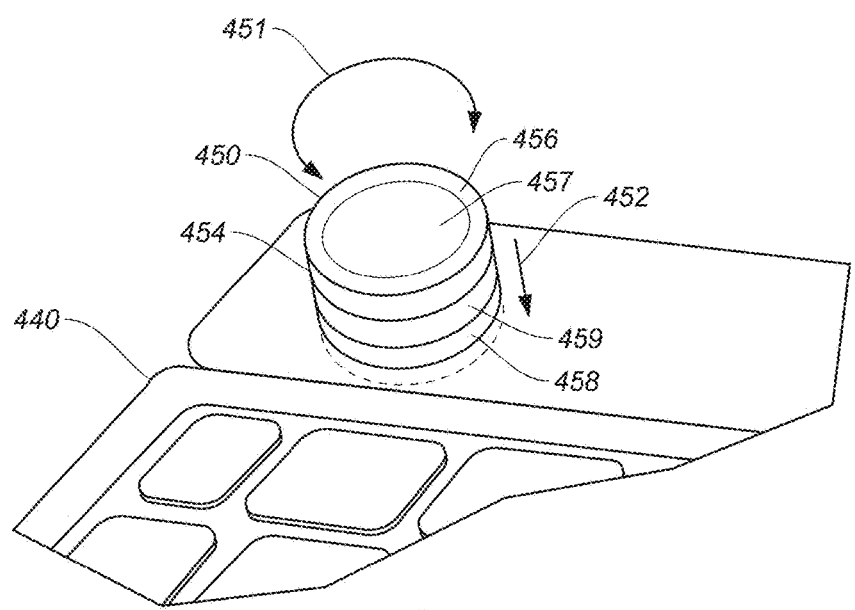
FIG. 4A shows a user-manipulable element, according to certain embodiments.

FIG. 4A shows a user-manipulable element 450, according to certain embodiments. User-manipulable element ("knob") 450 can be disposed on any suitable input device (e.g., keyboard 440) and may include top surface 456 and side surface 458. Top surface 456 may include touch sensor(s) 457 and side surface 458 may include touch sensor(s) 459. Knob 450 can be rotated along path 451 and, in some cases, can be depressible along path 452 to register a "button click" as would be understood by one of ordinary skill in the art.

Figures 4B, 4C:
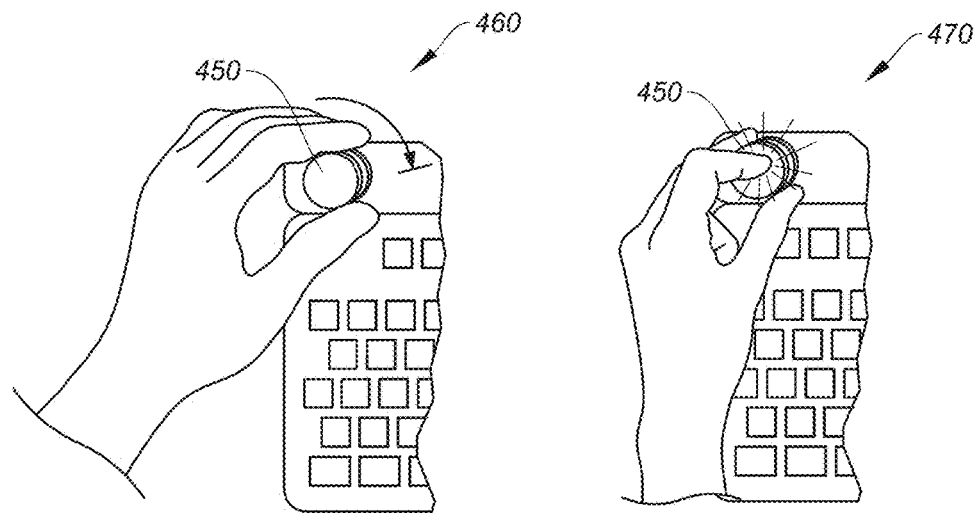
FIG. 4B shows an example of multi-touch detection on a user-manipulable element, according to certain embodiments.
FIG. 4C shows an example of multi-touch detection on a user-manipulable element, according to certain embodiments.

Knob 450 can include various performance characteristics that can be set or controlled locally (e.g., by processor 210), remotely (e.g., via control signal generated by processor(s) 302), or a combination thereof. Some performance characteristics can include a rotation resistance of knob 450, a rotational input resolution of knob 450 (e.g., rotation sensitivity), a depressible knob function, setting a ratchet or non-ratchet mode of operation (e.g., via a magnetic clutch and ratchet system disposed in knob 450—as described below in conjunction with FIGS. 5-7) to knob 450 based on properties of an editable parameter (e.g., associated with a selectable control element on a host computing device—further discussed below). In certain embodiments, touch sensors 457, 459 can detect a single touch or simultaneous touches. For example, FIG. 4B shows an example of multi-touch detection on a user-manipulable element, according to certain embodiments. Specifically, two locations on side sensor 459 can be contacted and simultaneously detected for any suitable functionality. In some cases, multiple touches on top touch sensor 457 may be detected and differentiated. One performance characteristic of touch sensors can include a touch sensitivity (e.g., resolution). In some cases, one or more touch sensors on knob 450 (e.g., sensor 454, 457) can operate as a touch pad. For example, the touch sensors 454, 457 can allow a user to control a cursor on a display. In further embodiments, knob 450 can be a standalone device (e.g., not associated with other components). For instance, knob 450 may not be associated with another input device (e.g., keyboard, computer mouse, etc.) and may operate independently (e.g., controlled by system 200).

In certain embodiments, touch sensors 454 and 457 may have similar functions, different functions, or complimentary functions. One example of a complimentary function is that top touch sensor 457 can be used for course adjustments (e.g., large scale zoom) while side touch sensor 454 may control fine adjustments (e.g., small scale zoom), as shown in FIG. 4C. In some cases, top touch sensor 457 can be used to enter a value (see, e.g., FIG. 12A), or open a menu (e.g., pressing sensor 457 opens a visual UI menu allowing a user to switch between functions by rotating knob 450 or selecting with a computer mouse-controlled cursor).

In some cases, a user may want to have a quick-access method of getting back to a global setting, such as a non-context sensitive setting for knob 450. For example, if a user is in a photo editing application and has a specific tool selected, turning knob 450 may change aspects of the selected tool. If the user wants to change a different parameter all together (e.g., volume), pressing down knob 450 (depressing along path 452) and rotating while knob 450 is depressed may be configured to perform an alternative function (e.g., switching to desktop, scroll up/down, volume control, etc.). One of ordinary skill in the art would understand the many variations, modifications, and alternative embodiments thereof.

Rotational resistance can range from no rotational resistance (e.g., no added resistance) to a high resistance to prevent a user from rotating knob 450. For example, if a value of an editable parameter (e.g., brightness) can be adjusted to a setting with a range of values from 0 to 100, knob 450 can be configured to provide a relatively high rotational resistance at each limit. For instance, a rotational resistance may be low (i.e., a user can easily rotate knob 450) from 1-99, and rotational resistance may be high (i.e., a user cannot rotate knob 450 any further) at 0 and 100. In some embodiments, the rotational resistance may follow a particular torque profile such that the rotational resistance is lowest at 50 and increases linearly or non-linearly as the minimum and maximum limits are approached. Any suitable force profile can be applied, as would be understood by one of ordinary skill in the art. Rotational resistance can be referred to as a torque friction, rotational friction, a torque profile (e.g., rotational resistance over a range), or the like.

Ratchet and non-ratchet mode may be set based on any suitable criteria. For example, ratchet mode may better apply to applications that have a finite number of settings, such as a selection of a number of available paint brushes in Photoshop®, a number of font sizes that are available, or the like. A non-ratcheted mode may be well suited for more analog settings that have a continuous or high number of settings, such as a selection of a color from a band of hundreds, thousands, or millions of available colors, a scroll bar (e.g., to scroll through a 100+ page document), a volume, or the like.

Aspects of a Magnetic Ratchet Assembly

Figure 5:
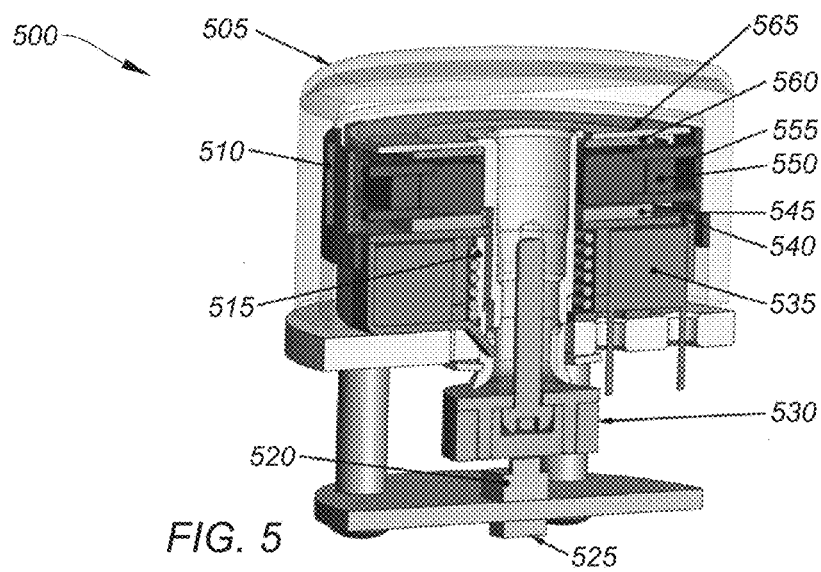
FIG. 5 shows a cutaway view of a user-manipulable element, according to certain embodiments.

FIG. 5 shows a cutaway view of a user-manipulable element ("knob") 500 with a magnetic ratchet system disposed therein, according to certain embodiments. A ratchet system can be used to implement a simulated ratcheting effect on knob 500 when activated. When deactivated, knob 500 may rotate freely with no ratcheting effect. In some embodiments, aspects of the ratcheting including the magnitude of each ratchet (e.g., how much travel between each ratchet "click") and a resistance of the ratchet (e.g., how much force is required to rotate knob 500 in ratchet mode) can be controlled by, for example, processor 210, processor 302, or a combination thereof, as further discussed below. In one example, knob 500 may be configured for a ratcheting mode of operation when a finite or limited number of quantized selections are available and/or low resolution is required. For instance, a font size or font type for alphanumeric text on a GUI may be appropriate. In that case, some users may find that it is intuitive to associate ratcheting or "clicking" with each selection. In another example, knob 500 may be configured for a non-ratcheting mode of operation when a large number of choices are available, high resolution is required, or a continuous gradient or scale of values can be selected. A ratcheting mode, even with high resolution (e.g., small "clicks") would necessarily skip certain values in a continuous spectrum of choices. A non-ratcheting mode can allow a user to select any value with high precision, which may be desirable in certain situations (e.g., selecting a color for a 3D model in a continuous spectrum of available colors). One of ordinary skill in the art would understand the many variations, modifications, and alternative embodiments thereof.

Figure 6:
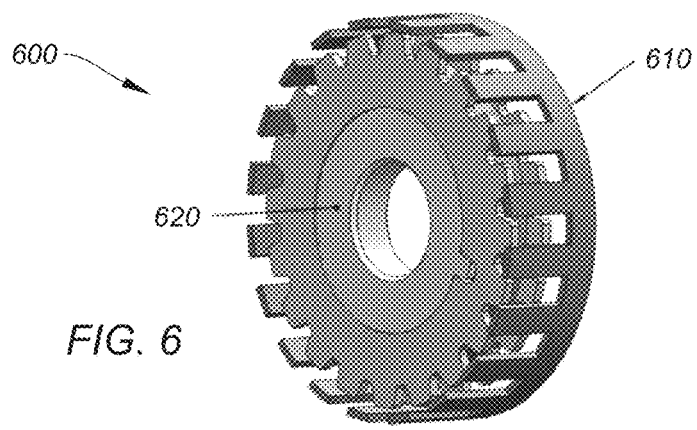
FIG. 6 shows a magnetic ratchet for a user-manipulable element, according to certain embodiments.
Figure 7:
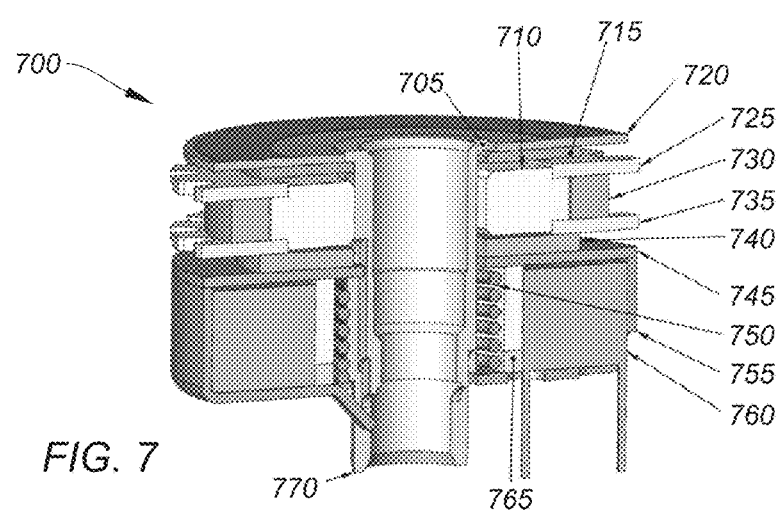
FIG. 7 shows a bi-stable clutch mechanism for an input device, according to certain embodiments.

In certain embodiments, a ratcheting effect is implemented via knob 500, as shown and described with respect to FIGS. 5-7 and the accompanying Appendix. In some embodiments, a knob with an embedded magnetic ratcheting system may include a magnetic ratchet, a clutch including a fixed disc and a mobile friction disc, a bi-stable electromagnetic clutch actuator, a magnetic angular sensor, a switch actuated by axial displacement of the knob, and a proximity detector electrode on the shaft end. Referring to FIG. 5, knob 500 includes knob portion 505, knob ratchet armature 510, switch 520, angular sensor 525, angular sensor magnet 530, bi-stable electromagnetic clutch actuator 535, clutch control mobile armature 540, non-magnetic clutch disc 545, switchable magnetic wheel 550, ratchet assembly 555, fixed friction disc 560, and printed circuit board (PCB) with electrode proximity detection 565. The operation of which would be understood by one of ordinary skill in the art with the benefit of this disclosure.

FIG. 6 shows magnetic ratchet 600 for a user-manipulable element, according to certain embodiments. In some embodiments, magnetic ratchet 600 can include two similar armatures with teethed wheels and a ring magnet assembled on a plastic rim. Improved torque efficiency can be obtained with two air gaps contributing to a reluctance variation. Magnetic ratchet 600 is shown with knob armature 610, and armature magnet assembly 620, which can be free or locked. The operation of which would be understood by one of ordinary skill in the art with the benefit of this disclosure.

FIG. 7 shows a bi-stable clutch mechanism 700 for an input device (e.g., knob 450), according to certain embodiments. A bi-stable function of the actuator may be obtained by adding a non-linear force of a reluctant magnetic circuit loaded by a ring magnet and a nearly constant force of a helicoidal spring (see, e.g., the Appendix). In some implementations, the spring force can contribute to brake the teethed armatures to achieve the ratcheting effect by pushing against the clutch disc. When the ratchet is off, the magnetic reluctance force may be higher than the spring force, causing the magnetic circuit to remain closed and allowing the ratchet wheel to turn freely. In some embodiments, a non-magnetic clutch disc can be placed between the ratchet wheel (teethed armatures) and the clutch control armature to separate the two magnetic circuits. In some cases, the non-magnetic clutch disc can also be used to adapt the gap of the control system because the other parts stacked on the shaft may not be able to be controlled with tight tolerances. The clutch position can be controlled by means of a coil. To switch off the ratchet effect, a negative current can be fed into the coil to produce a pulling force on the clutch control armature (e.g., moving clutch disc), which can be higher than the spring force. Referring to FIG. 7, bi-stable clutch mechanism 700 can include a passage for an electrode wire 705, a plastic ratchet bearing 710, a clutch fixed magnetic disk 715 (e.g., crimped on the shaft), a PCB with electrode 720, teeth armature 725, ratchet ring magnet 730, teeth armature 735, non-magnetic clutch disc 740, clutch control armature 745, spring 750, coil bell armature 755, coil 760, ring magnet 765 and shaft 770. The operation of which would be understood by one of ordinary skill in the art with the benefit of this disclosure.

Although many of the embodiments described herein use an electro-magnetic actuator to implement the ratchet/non-ratchet functions, it should be understood that other implementations may use different mechanisms to provide a controllable ratchet function. For instance, some embodiments may employ mechanical/friction ratchet mechanisms that can be actuated by a direct current (DC) motor (e.g., see Appendices). One of ordinary skill in the art with the benefit of this disclosure would understand the many variations, modifications, and alternative embodiments thereof.

At a high level of abstraction, software operating on a host computing device (e.g., executed by processor 302) typically manages mapping functions (e.g., mapping editable parameters associated with selectable control elements with user-manipulable element (e.g., knob 450) on an input device, as further discussed below) and interfacing between computer software running on the host computing device (e.g., Photoshop®) and the connected input device (e.g., knob 450). Alternatively or additionally, some management may be performed, in part, by aspects (e.g., processor 210) of the corresponding input device. From a user perspective, the user-manipulable element may be associated with the graphical element closest to a cursor on a display. For example, as a user moves a cursor toward a first graphical element (e.g., selectable control element), knob 450 can be dynamically programmed to control an editable parameter (e.g., font type) associated with that graphical element. Similarly, as the user moves the cursor towards a second selectable control element, knob 450 may be automatically and dynamically programmed to control an editable parameter (e.g., volume) associated with the second selectable control element. Alternatively or additionally, associating the user-manipulable object with the editable parameter of a selectable control element can be based on other criteria other than a location of a cursor. For example, a selectable control element may be selected to be associated with a user-manipulable object based on historical usage. Thus, a "most used" selectable control element may be selected irrespective of the location of the cursor. Other methods of selection are possible, as would be understood by one of ordinary skill in the art. The following embodiments describe just some of the many embodiments that fall within the purview of this disclosure.

Figure 8:
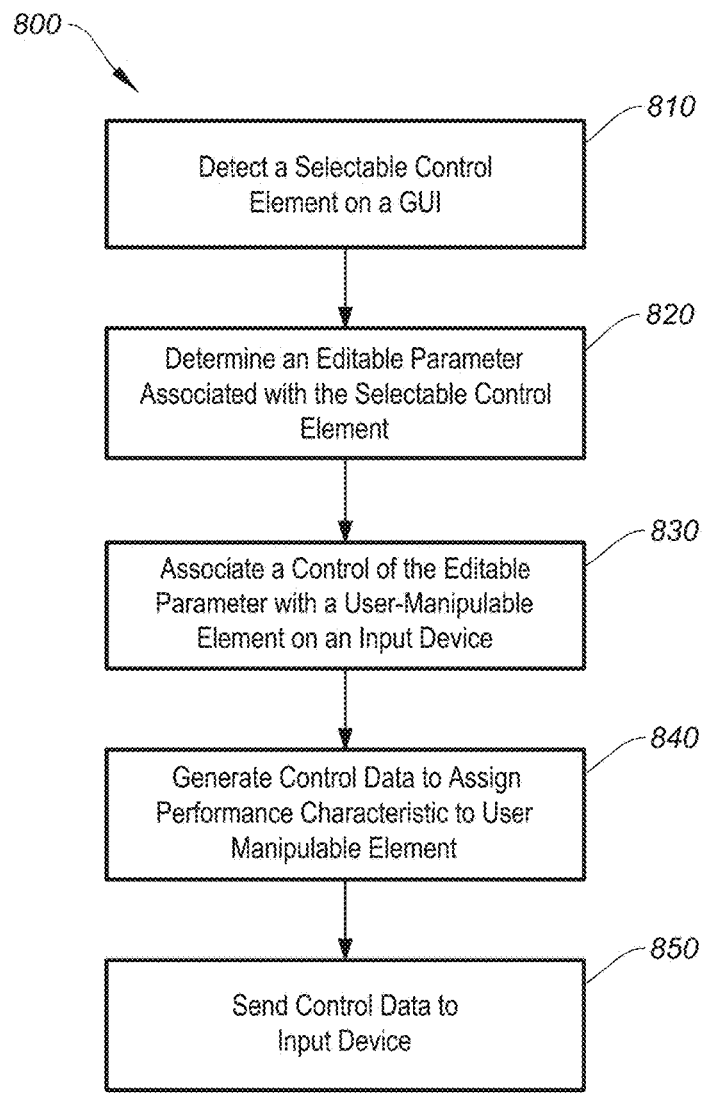
FIG. 8 shows a simplified flow diagram for associating a function with a user-manipulable element on an input device, according to certain embodiments.

FIG. 8 shows a simplified flow diagram 800 for associating a function with a user-manipulable element on an input device, according to certain embodiments. Method 800 can be performed by processing logic that may comprise hardware (circuitry, dedicated logic, etc.), software operating on appropriate hardware (such as a general purpose computing system or a dedicated machine), firmware (embedded software), or any combination thereof. In certain embodiments, method 800 can be performed by processor 302 of system 300, as shown and described above with respect to FIGS. 1 and 3.

At step 810, method 800 can include detecting, by a processor 302 on a host computing device 110, a selectable control element on a graphical user interface (GUI), according to certain embodiments. A GUI can be a graphical window, virtual desktop, applications, or any image on a display (e.g., display 120) that a user can interact with. A selectable control element can include any graphical element that can be controlled by a user. For example, some common selectable control elements can include desktop or window-based selectable icons, scroll bars, task bar elements, tabs, text, media players, media player controls (e.g., volume, pan, bass/treble, media transport controls, etc.), hyperlinks, or the like. One of ordinary skill in the art would understand the many possible types of selectable control elements that could be selectable on a GUI. In some embodiments, some control elements may not be "selectable" such that a user cannot manipulate or interact with the control element. For instance, a web page or PDF document may have a single page with no controllable element (e.g., no scroll bar). In such instances, non-selectable elements, such as alphanumeric text may be detected and used as described herein. In further embodiments, certain control elements may not be "selectable" from a current view and may be nested in various dropdown menus or interfaces. For example, a media player may include different skins (e.g., background images) with a selectable list of skins (i.e., the control element) buried in a nested menu. In such instances, the control element is not immediately selectable in a current view (outside of the corresponding menu bar), but can be detected nonetheless by host computing device 110. In certain embodiments, software configuring knob 450 may access particular software operating on the host computing device to determine what elements are included in a particular window. For instance, presentation software can be accessed to determine what is included in each particular slide (e.g., embedded hyperlinks, spreadsheets, images, etc.), which is readily available and easily accessible as would be understood by one of ordinary skill in the art. Similarly, photo editing software (e.g., Photoshop®) can be accessed to determine what selectable control elements (e.g., icons, menus, etc.) are available. It should be understood that the various methods of identifying elements described with respect to FIG. 8 can be applied to any of the figures, embodiments, systems, or methods, etc., described herein, as would be understood by one of ordinary skill in the art.

At step 820, method 800 can include determining, by processor 302, an editable parameter associated with the selectable control element, according to certain embodiments. An editable parameter can be any adjustable value, setting, mode of operation, or the like, associated with the selectable control element. For example, a selectable control element can be alphanumeric text and the editable parameter can include a font size, font type, font color, text position (e.g., text can be moved on the display in an x and y direction), or the like. In another example, a media player can be the selectable control element and the editable parameter can include a volume, pan, bass/treble settings, media transport controls, and the like. In a further example, a photo may be the selectable control element and the editable parameters can include a zoom (magnification), pan control, brightness, contrast, filter selection, etc. One of ordinary skill in the art would understand the many variations, modifications, and alternative embodiments of possible selectable control elements and editable parameters.

At step 830, method 800 can include associating a control of the editable parameter with user-manipulable element 150 on an input device 140, according to certain embodiments. User-manipulable element 150 can be a knob, button, scroll wheel, trackball, joystick, slider, or the like, as would be understood by one of ordinary skill in the art. One example of associating a control of the editable parameter with user-manipulable element 150 (knob 150) can include associating a font-size selection for alphanumeric text on display 120 with knob 150. More non-limiting examples of are provided in FIGS. 9-13C. The examples provided herein generally describe associating a control of the editable parameter with a single user-manipulable element 150. Some embodiments may associate the editable parameter with multiple user-manipulable elements 150. In some cases, the same editable parameter for a selectable control element can be associated with different user-manipulable elements 150 based on certain contexts. For instance, a volume control on a media player may be associated with knob 150 during typical use, but may opt to associate the volume control with a slider or touch sensor on keyboard 140 when certain applications (e.g., digital audio workstation) are in use to, for example, make knob 150 available for other purposes. Control data and control signal can be used interchangeably throughout this disclosure.

At step 840, method 800 can include generating control data to assign a performance characteristic to user-manipulable element 150 based on properties of the editable parameter. The control data can be in any suitable format that can control aspects (e.g., user-manipulable element 150) of input device 140, as would be understood by one of ordinary skill in the art. A performance characteristic for knob 150 can include a rotation resistance of the knob, a rotational input resolution of the knob (e.g., rotation sensitivity), setting a ratchet or non-ratchet mode of operation for the knob (e.g., via an internal magnetic clutch) based on the properties of the editable parameter, or a depressible feature (e.g., knob 150 can be depressed like a button click). For buttons, touch sensors, sliders, or any other user-manipulable element 150, editable parameters can include button sensitivity, touch sensitivity, haptic feedback intensity, or the like. One of ordinary skill in the art would understand the many variations, modifications, and alternative embodiments thereof. Steps 830 and 840 can be separate steps or can be performed in a single step (e.g., generating control data to both associate an editable parameter with a user-manipulable element and assign a performance characteristic to the user-manipulable element. At step 850, method 800 can include sending, by the host computing device (e.g., processor 302), the control signal to the input device (e.g., processor 210).

It should be appreciated that the specific steps illustrated in FIG. 8 provide a particular method 800 for assigning a function to a user-manipulable element on an input device, according to certain embodiments. Other sequences of steps may also be performed according to alternative embodiments. For example, alternative embodiments may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. For example, method 800 can further include receiving a first input data corresponding to a rotation of the knob, receiving a second input data corresponding to the rotation of the knob, and applying the first input data and second input data to the editable parameter as a single continuous input when the first and second inputs are received within a threshold time. In this example, a user may turn knob 150 by 180 degrees, let go of knob 150, and re-grab knob 150 to turn it for an additional 70 degrees (e.g., if the user cannot sufficiently turn knob 150 in a single turn). To determine whether the user intended the two turns to be separate or treated as a single continuous turn, a threshold time (e.g., less than 1 second) can be tracked between each input. For multiple inputs that occur within the threshold time, the inputs can be treated as a single continuous input. Any suitable threshold time can be used, which may be shorter or longer that the examples provided herein.

In another example, method 800 can further include receiving, by processor 302, input data corresponding to a movement of a cursor on the GUI, where the detecting the selectable control element on the GUI occurs in response to detecting when the cursor is placed over the selectable control element. One of ordinary skill in the art would recognize and appreciate many variations, modifications, and alternatives of method 800.

Figure 9:
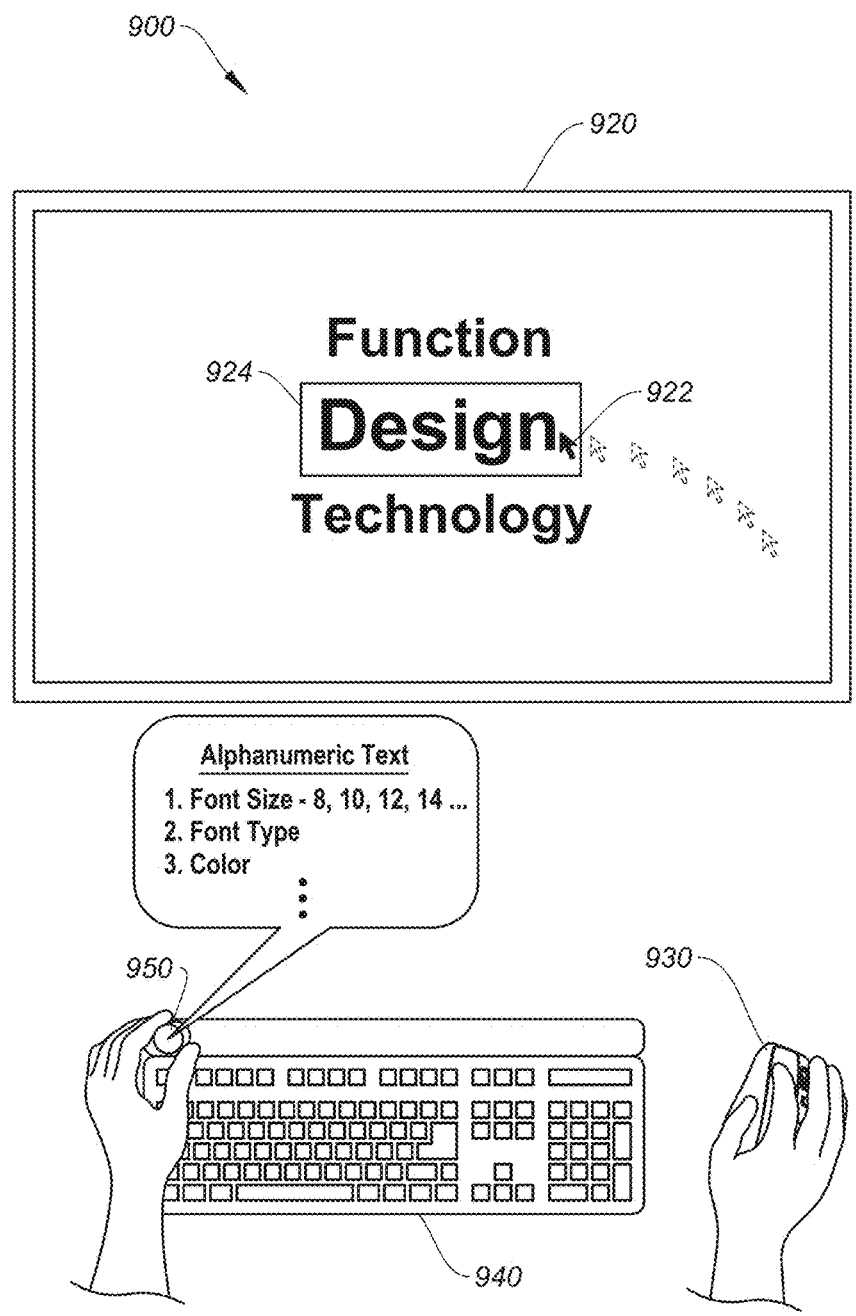
FIG. 9 shows aspects of associating a function with a user-manipulable object, according to certain embodiments.

FIG. 9 shows aspects of a system 900 for associating a function with an input device that corresponds to a selectable control element on a display, according to certain embodiments. More specifically, a user manipulates first input device 930 (e.g., computer mouse, presenter, etc.) to move cursor 922 over selectable control element ("text") 924 on display 920. The host computer (e.g., host computer 110) can then detect control element 924, determine certain editable parameters associated with text 924, associate a control of the editable parameter with a user-manipulable element (e.g., knob 950) on a second input device (e.g., keyboard 940) and generate a control signal to cause the second input device (e.g., processor 210 of keyboard 940) to assign a performance characteristic (e.g., knob rotation) to the user-manipulable element based on properties of the editable parameter. For instance, text 924 can include editable parameters such as font size and font type, which can include a number of discrete values. Thus, processor 302 may determine that a rotation function would be better suited to cycle through available values (e.g., font sizes 8-72) then successive button presses (e.g., depressing knob 950) or successive touch sensor touches (e.g., touch sensor 457) may be. In some embodiments, processor 210 of input device 940 may determine the appropriate user-manipulable element to apply, while host computer 110 merely sends a control signal indicating what editable parameters need to be assigned. In some cases, the assignment can be controlled, in part, by both processors 302 and 210. One of ordinary skill in the art with the benefit of this disclosure would understand the many variations, modifications, and alternative embodiments thereof. Control element 924 can include alphanumeric text.

In some embodiments, multiple editable parameters can be associated with a user-manipulable element (e.g., rotation of knob 950) and prioritized in a hierarchical fashion. Referring to FIG. 9, a font size, font type, and font color are associated with alphanumeric text 924 and assigned to knob 950, respectively. In certain aspects, a user can cycle through and switch between each editable parameter. For instance, a detected touch on a touch sensor (e.g., sensor 457) may execute a switch from font size to font type. A subsequently detected touch on the touch sensor may cause a switch from font size to font color, and so on. One of ordinary skill in the art would understand the many variations, modifications, and alternative embodiments thereof.

The example shown in FIG. 9 shows a user manually selecting control element ("text") 924. Alternatively or additionally, system 900 may automatically select a selectable control element without requiring user interaction. Automatic selection can be performed based on any suitable criteria, such as a hierarchy of preferred editable parameters, by machine learning based on previous user selections and interactions, by application-based preset conditions, or the like, and by any combination thereof.

FIG. 10 shows aspects of associating a function with a user-manipulable object 150 on an input device 1040, according to certain embodiments, and includes display 1020 (e.g., operated by aspects of system 300), keyboard 1040 (e.g., operated by aspects of system 300), and knob 1050. As described above, a ratchet or non-ratchet mode of operation can selectively be applied to a user-manipulable control based on properties of a corresponding editable parameter. In some cases, it may be advantageous to apply a ratchet mode of operation to knob 1050 when alphanumeric text is detected on display 1020, as a limited number of discrete settings (e.g., font size, font type, number of brushes, number of selectable tabs, etc.) may be more intuitively controlled with discrete positions on knob 1050. Referring to FIG. 10, as knob 1050 is rotated clockwise, larger discrete font sizes (or any suitable editable parameter associated with a detected selectable control element) are applied to the corresponding text (e.g., selectable control element) on display 1020. In alternative embodiments, font size or font type could, for example, be associated with knob 1050 having the ratchet mode turned off such that the rotation of knob 1050 is smooth and changes in the underlying editable parameter can be configured to change between values as knob 1050 is rotated a certain distance (e.g., switch values every 20 degree rotation). In some embodiments, multiple performance characteristics may be associated with a single editable parameter. For instance, knob 1050 may be configured to control a font type as knob 1050 is rotated, a ratchet mode may be applied, and a resistance of rotation may be configured to increase or decrease as the selected values increase or decrease. One of ordinary skill in the art would understand the many variations, modifications, and alternative embodiments thereof.

In some embodiments, the number of ratchet positions in 360 degrees of rotation can be controlled by software operating on host computing device (e.g., via method 800). In some cases, a ratchet torque (e.g., rotational resistance) can be configured to correspond to a number of ratchet positions. For example, a low number of ratchet positions (e.g., line width) may have a higher relative rotational resistance associated with it (e.g., harder for a user to rotate knob 1050), while a high number of ratchet positions (e.g., number of brushes) may have a lower relative rotational resistance associated with it (e.g., easier for a user to rotate knob 1050). Some embodiments can include very high rotational resistance when a minimum or maximum software value is reached to indicate to the user that the corresponding parameter (e.g., volume) cannot be increased or decreased beyond a current value. In some cases, a default value may have a higher rotation resistance than adjacent ratchet settings to indicate a center position, default value, preferred setting, or the like. One of ordinary skill in the art would understand the many variations, modifications, and alternative embodiments thereof.

FIG. 11 shows aspects of associating a function with a user-manipulable object 1150 on an input device 1140, according to certain embodiments, and includes display 1120 (e.g., operated by aspects of system 300), keyboard 1140 (e.g., operated by aspects of system 300), and knob 1150. As described above, a ratchet or non-ratchet mode of operation can selectively be applied to a user-manipulable control based on properties of a corresponding editable parameter. In some cases, it may be advantageous to apply a non-ratchet mode of operation to knob 1150 when an image is detected on display 1120 and a corresponding editable parameter has a very high number of settings (e.g., continuous, high resolution color gradient). In such cases, it may be more intuitively controlled with a continuous rotation on knob 1150. Referring to the non-limiting example shown in FIG. 10, as knob 1150 is rotated clockwise, value indicator 1165 can increase as it moves to the right on color gradient selection bar 1160. Typically, non-ratchet conditions may be well-suited for editable parameters that have high granularity, sensitive adjustments, or the like. Alternatively, some embodiments may employ a ratchet mode of operation to select colors. One of ordinary skill in the art would understand the many variations, modifications, and alternative embodiments thereof.

In certain embodiments, a non-ratchet mode may be applied to provide a user with an "analog" control over the associated editable parameter. In some cases, the friction torque (e.g., rotational resistance) of knob 1150 can depend on the software parameter type (e.g., editable parameter). For instance, scrolling in a large document may cause knob 1150 to be configured in non-ratchet mode with a low rotational resistance (e.g., for fast scrolling), while a volume control (e.g., selectable control element) may cause knob 1150 to have a high rotational resistance (e.g., to prevent inadvertent large changes in volume). Rotational resistance may be set to a maximum value when a minimum or maximum value for an editable parameter is met (e.g., scroll at top or bottom of document). In some cases, a default value may have a higher rotational resistance than adjacent settings of knob 1150 to give the impression of a single ratchet "dip" at a default position. One of ordinary skill in the art would understand the many variations, modifications, and alternative embodiments thereof.

FIG. 12A shows aspects of associating a function with a user-manipulable object on an input device, according to certain embodiments. In certain situations, a user may want to cycle through a number of settings and/or values to determine a preferred outcome without necessarily entering the value until they are sure of their selection. In such cases, a touch sensor (e.g., touch sensor 457) disposed on knob 1250 can be configured to enter a currently selected value when touched. Referring to FIG. 12A, the alphanumeric text "design" is selected and the user is manipulating knob 1250 to set a particular value for a corresponding editable parameter (e.g., font size). The user can then tap the touch sensor on knob 1250 to "enter" the value selected, thereby confirming a user intent to apply a specific setting. In some embodiments, processor 210 may receive the touch sensor input signal and relay the signal to the corresponding host computing device (e.g., host computer 110) to apply the setting. Alternatively or additionally, the control signal from the host computer that initially detected the "design" text and determined one or more associated editable parameters may cause the touch sensor of knob 1250 to control the "enter value" function as described above. In some cases, the control signal may provide the editable parameters and the input device (e.g., processor 210) may select and control which user manipulable element is assigned the "enter value" function. One of ordinary skill in the art would understand the many variations, modifications, and alternative embodiments thereof.

FIG. 12B shows aspects of associating a function with a user-manipulable object on an input device, according to certain embodiments. In certain situations, a user may want to switch between editable parameters to achieve a particular setting for the selectable control element. In such cases, a touch sensor (e.g., touch sensor 457) disposed on knob 1250 can be configured to switch between selectable elements associated with a currently selected control element. Referring to FIG. 12B, the alphanumeric text "technology" is selected. In response to the user touching the touch sensor, the selected editable parameter switches from font size to font type, and subsequent rotations of knob 1250 change the font type accordingly. In some embodiments, processor 210 may receive the touch sensor input signal and relay the signal to the corresponding host computing device (e.g., host computer 110) to apply the setting. Alternatively or additionally, the control signal from the host computer that initially detected the "design" text and determined one or more associated editable parameters may cause the touch sensor of knob 1350 to control the "enter value" function as described above. In some cases, the control signal may provide the editable parameters and the input device (e.g., processor 210) may select and control which user manipulable element is assigned the "switch" function. In some embodiments, the switching function (or any function) can be associated with other controls, keys, etc. (e.g., assigned hot keys, function keys, etc., of a corresponding input device).

Some embodiments may associate other functions with the one or more touch sensors on knob 1250. For instance, short presses, long presses, multiple presses, and the like, can be configured to cause different functions to occur. In some cases, a single short press may implement validation (e.g., enter a value of an editable parameter—as described above), a long press may switch the editable parameter of the corresponding selectable control element, and a double tap may change a position in a menu hierarchy (e.g., switching from a first level including fonts, colors, and tools, to a lower level of fonts including font size and font type). One of ordinary skill in the art would understand the many variations, modifications, and alternative embodiments thereof.

Proximity detection can be used with the one or more touch sensors, according to certain embodiments. For instance, power management functions (e.g., operated by power management system 230) may be associated with proximity detection where the supporting electronics for knob 1250 can turn on when a user's hand is determined to be in close proximity, which may be advantageous for power sensitive cordless input devices (e.g., keyboards, computer mice, etc.). One of ordinary skill in the art would understand the many variations, modifications, and alternative embodiments thereof.

Figures 13A, 13B, 13C:
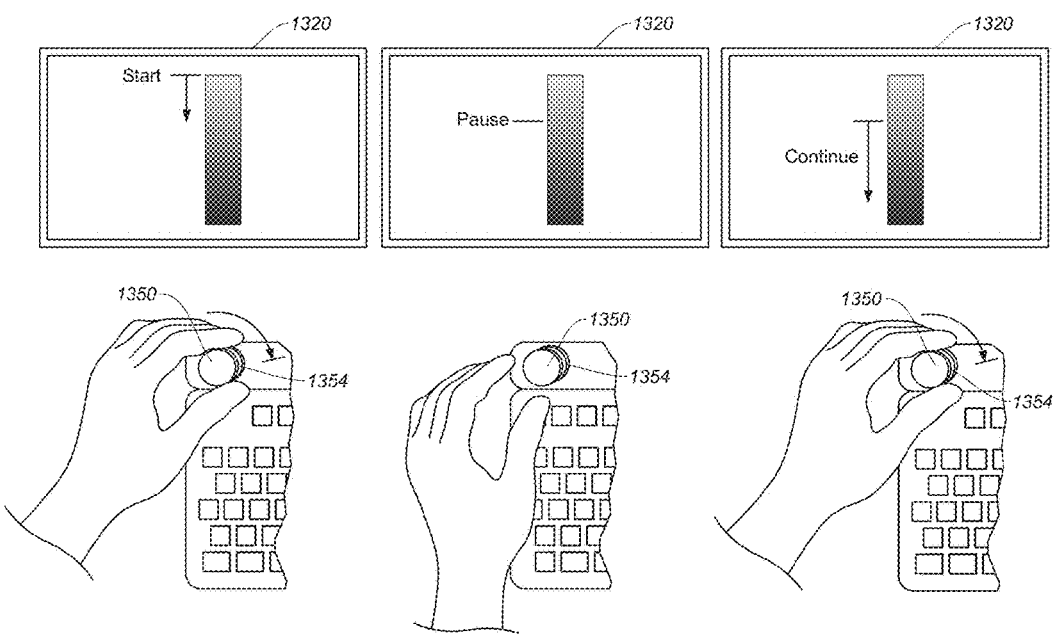
FIG. 13A-C shows aspects of associating a function with a user-manipulable object on an input device, according to certain embodiments.

FIGS. 13A-C show aspects of associating a function with a user-manipulable object, according to certain embodiments. FIGS. 13A-C include display 1320 with a selected control element (e.g., gray scale gradient bar), a knob 1350 on an input device, and a corresponding touch sensitive region 1354 around a side portion or perimeter of knob 1350. In some cases, a user may wish to adjust an editable parameter associated with knob 1350 to a value that they cannot reach with a single rotation. In some configurations, an adjusted value may revert back to a default value when a user let's go of knob 1350 (e.g., touch sensor 1354 may detect that a user is no longer touching knob 1350). This may be the case when entering a value occurs in response to touching a touch sensor, as discussed above with respect to FIG. 12A. With this setting, it can be cumbersome and inefficient is a user has to keep their fingers on a touch sensor while trying to rotate a knob beyond 270 degrees or more, for example. One solution may be to tap touch sensor 1250 half way through the rotation to "save" the setting and then re-grip the knob to continue the rotation.

In certain embodiments, a threshold time can be used to determine when an input is intended to be completed. For instance, in FIG. 13A, the user rotates knob 1350 approximately 100 degrees causing an adjustment of a gray-scale gradient bar on display 1320. In FIG. 13B, the user let's go of knob 1350 and repositions his hand to continue rotating knob 1350, causing adjustment of the gradient bar to pause. In FIG. 13C, the user continues the rotation of knob 1350 for an additional 100 degrees, thereby causing the adjustment of the gradient bar to continue. In some embodiments, if the time between the user letting go of knob 1350 in FIG. 13B and re-gripping knob 1350 in FIG. 13C is less than a threshold time (e.g., 2 seconds), then the adjustments of FIGS. 13A and 13C are treated as a continuous adjustment and the default auto-reset function mentioned above would be avoided. The threshold time can be any suitable value and may be shorter or longer than the examples provided herein. Thus, in certain embodiments, processor 210 can receive a first input data corresponding to a rotation of knob 1350, receive a second subsequent input data corresponding to the rotation of knob 1350, and apply the first input data and second input data to a corresponding editable parameter as a single continuous input when the first and second inputs are received within the threshold time.

In some embodiments, touch sensors 1354 can detect multiple simultaneous touches (e.g., thumb, forefinger, and middle finger detection when adjusting knob 1350), which can be useful for location-dependent touch detection. For instance, some embodiments may increase a sensitivity of the adjustment of an editable parameter when a user grips knob 1350 with three fingers instead of two. In some cases, a memory buffer (e.g., memory array 220 or 308) can be used to store how certain users interact with knob 1350. For instance, a first user may typically use two fingers at diametrically opposed locations on knob 1350 (i.e., user grip profile), while a second user may typically grip knob 1350 with three fingers, or with two fingers at different non-diametrically opposed locations. In such instances (e.g., through machine learning via processor 210 and/or 302), certain editable parameters with particular sensitivities may be assigned to knob 1350 in response to detecting a particular selectable control element when the first user is determined to be interacting with knob 1350 (e.g., based on previous first user interactions), and different editable parameters with different sensitivities may be assigned to knob 1350 in response to detecting the selectable control element when the second user is determined to be interacting with knob 1350 (e.g., based on the grip profile). One of ordinary skill in the art would understand the many variations, modifications, and alternative embodiments thereof.

Figure 14:
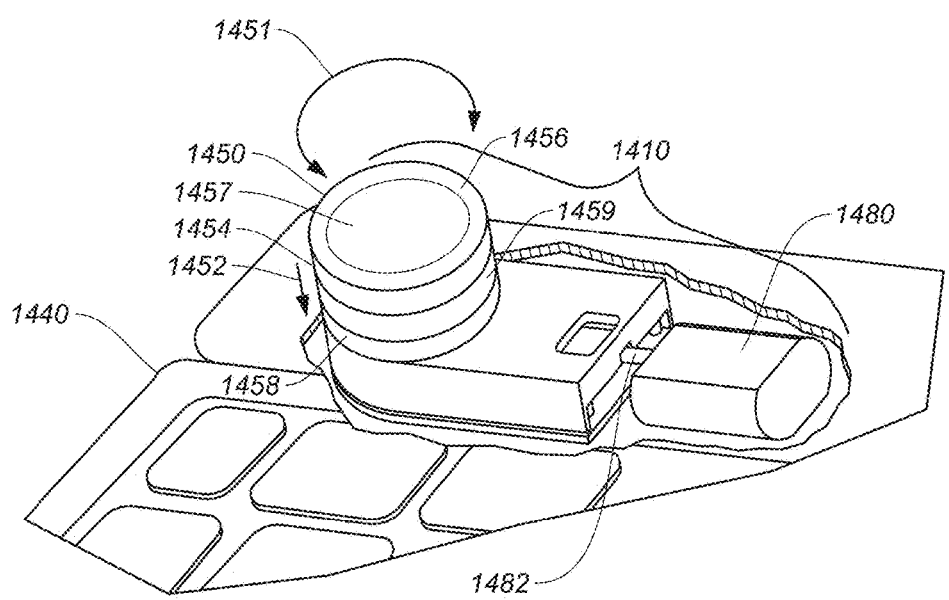
FIG. 14 shows a cut away view of a typical arrangement for a mechanical ratchet system for a knob implemented in a keyboard, according to certain embodiments.

Aspects of a Mechanical Ratchet System with Friction for a User Manipulable Element In certain embodiments, a mechanical ratchet system with friction, as described below at least with respect to FIGS. 14-24, provides for a dynamic software-controlled operation of a user manipulable element (e.g., a "knob") capable of switching between a ratcheted mode of operation and a resistance mode (e.g., non-ratcheted mode) of operation based on a contextual usage, similar to knob 450 of FIG. 4. Although the foregoing discussion is primarily focused on shifting between a ratcheted and non-ratcheted mode of operation, it should be understood that embodiments utilizing the mechanical ratchet assembly can incorporate any other aspects described herein, including but not limited to, one or more touch sensors, stand-alone operation (i.e., no corresponding input device), "button-click" operation, or the like. FIG. 14 shows knob 1450 disposed on keyboard 1440, however knob 1450 may be disposed on other types of input devices including computer mice, game controllers, remote controls, tablet computers, virtual or augmented reality devices, smart phones, wearable smart devices, laptop computers, netbook computers, head phones, or the like.

FIG. 14 shows a cut away view of a typical arrangement for a mechanical ratchet system 1410 for a knob 1450 implemented in a keyboard (1440), according to certain embodiments. Knob 1450 can be disposed on any suitable input device (e.g., keyboard 1440) and may include top surface 1456 and side surface 1458. Top surface 1456 may include touch sensor(s) 1457 and side surface 1458 may include touch sensor(s) 1459. Knob 1450 can be rotated along path 1451 and, in some cases, can be depressible along path 1452 to register a "button click" as would be understood by one of ordinary skill in the art.

Knob 1450 can include various performance characteristics that can be set or controlled locally (e.g., by processor 210), remotely (e.g., via control signal generated by processor(s) 302), or a combination thereof. Some performance characteristics can include a rotation resistance (e.g., of knob 1450), a depressible knob function, or setting a ratchet or non-ratchet mode of operation (e.g., via mechanical ratchet system 1410) of knob 1450 based on properties of an editable parameter (e.g., associated with a selectable control element on a host computing device). In further embodiments, knob 1450 can be a standalone unit. For instance, knob 1450 may not be associated with another input device (e.g., keyboard, computer mouse, etc.) and may operate independently (e.g., controlled by system 200 operating the mechanical ratchet assembly).

Rotational resistance can range from no rotational resistance (e.g., no added resistance) to a high rotational resistance to prevent a user from rotating knob 1450, as described above with respect to FIG. 4 (including all of its corresponding permutations). The rotational resistance (e.g., in non-ratchet mode) may follow a particular torque profile such that the rotational resistance is lowest at a center position (e.g., a value of 50 out of 100) and increases linearly or non-linearly as the minimum (e.g., 0 of 100 levels of resistance) and maximum (e.g., 100 of 100) limits are approached. Any suitable force profile can be applied, as would be understood by one of ordinary skill in the art. Rotational resistance can be referred to as a torque friction, rotational friction (or just "friction"), a torque profile (e.g., rotational resistance over a range), or the like. Furthermore, the ratchet and non-ratchet mode may be set based on any suitable criteria (see, e.g., the description of FIG. 4). The amount of rotational resistance can be referred to as an "intensity." In some embodiments, a high intensity rotational resistance may range around 5-10 mNm, or other suitable value, while low intensity rotational resistances may range around 1 mNm and lower.

A ratchet mode can also operate over a range of intensities from a high ratcheted resistance (e.g., 5 mNm, 10 mNm) to a relatively low ratcheted resistance (e.g., 1 mNm). Different force profiles may be used, as discussed above, which can implement different ratchet intensities. Changing the ratcheting intensity and rotational resistance intensity may be achieved, for instance, by mechanical ratchet system 1410 or any of the embodiments provided herein.

FIG. 15 shows a simplified example of a mechanical ratchet system 1500 for a knob (e.g., knob 450), according to certain embodiments. To provide a conceptual understanding of certain embodiments, a high level example is provided. In simple terms (and in a single, non-limiting embodiment), a helicoidal torsion spring ("biasing mechanism") can function as a frictional brake and as a ratchet roller pusher. One side of the spring can be coupled to the roller and the other side may provide friction by sliding on a smooth portion of the ratchet wheel. A lever can lift one or the other side of the spring arms which can make the ratchet or the friction to act on the knob torque. The lever may be moved by means of an eccentric cam, which can be part of a gear of a right angle reduction assembly. A gear that includes the eccentric cam can rotate 180° between 2 mechanical stops (i.e., positions 1 and 2), which causes the switching between the ratchet and friction modes of operation.

Referring back to FIG. 15, mechanical ratchet system ("MRS") 1500 can include knob housing 1510, a knob shaft (not visible in FIG. 15; see, e.g., FIG. 16), wheel 1530 with toothed perimeter 1535 and a smooth perimeter 1537. In some embodiments, there may be a separate ratchet wheel with a toothed perimeter and a resistance wheel with a smooth perimeter. MRS 1500 can further include lever 1540, biasing mechanism 1550, lever gear 1570 and electric motor ("motor") 1580.

Biasing mechanism 1550 can be a spring (e.g., helicoidal spring) or other suitable device. Biasing mechanism 1550 may include first end 1555 (coupled to roller 1554) and second end 1557. Biasing mechanism 1550 may provide a force such that first end 1555 causes roller 1554 to engage with toothed perimeter 1535 of wheel 1530 and second end 1557 engages with smooth perimeter 1537 of wheel 1530. In some implementations, first end 1555 may contact toothed perimeter 1535 by default due to the force (e.g., "first force") provided by biasing mechanism 1550. Similarly, second end 1557 (obscured in the figure) may contact smooth perimeter 1537 by default due to the force (e.g., "second force") provided by biasing mechanism 1550. In some embodiments, biasing mechanism 1550 can be a torsion spring with ends 1555, 1557 extending from the coiled body in parallel when biasing mechanism 1550 is at rest. When biasing mechanism 1550 is installed in MRS 1500, each end is moved apart (overcoming a restoring force) to contact each side of wheel 1530 in the manner described above. That is, by default, a force is provided at each end toward wheel 1530. In simplified terms, the first and second ends 1555, 1557 of biasing mechanism 1550 can provide a force that squeezes (e.g., pinches) wheel 1530 at smooth perimeter 1537 and toothed perimeter 1535 (e.g., via roller 1554), such that both first and second ends 1555, 1557 normally (i.e. by default) contact perimeters 1535, 1537 when no other forces (e.g., via lever 1540) are acting on biasing mechanism 1550. In alternative embodiments, first and second ends 1555, 1557 may not contact their corresponding perimeters by default when no other forces are acting on biasing mechanism 1550.

In alternative embodiments, a wheel contacting interface (not shown) may be used instead of a biasing mechanism. A wheel contacting interface can be any suitable interface that does not generate and introduce a bias (e.g., force) on wheel 1530 (e.g., not a spring). In some cases, a wheel contacting interface may be shaped similar to biasing mechanism 1550 with first and second ends configured to contact toothed perimeter 1535 (e.g., via a roller) and smooth perimeter 1537, respectively. In simplified terms, the wheel contacting interface is operable to contact the perimeters 1535, 1537, but may or may not contact them by default. An outside force (e.g., from lever 1540) biases the wheel contacting interface (i.e., the first and second ends) to either cause the first end (e.g., via a roller) to engage with toothed perimeter 1535 thereby causing a ratcheted rotation when knob housing 1510 is rotated, cause the second end to engage the smooth perimeter 1537 to provide a rotational friction when knob housing 1510 is rotated, or cause a combination of both. One of ordinary skill in the art would understand the many variations, modifications, and alternative embodiments thereof.

In some embodiments, lever 1540 may be configured to switch between a first position and a second position. In some cases, when a ratchet mode of operation is selected, lever 1540 may be moved to a first position to cause second end 1557 (or roller 1554 on second end 1557) to disengage from smooth perimeter 1537. In contrast, when a resistance mode of operation is selected, lever 1540 may be moved to a second position to cause first end 1555 to disengage from toothed perimeter 1535. Lever 1540 may be coupled to biasing mechanism 1550 and lever gear 1570, as further discussed below.

MRS 1500 may further include motor 1580 coupled to lever gear 1570 via a linkage 1582 that may include a spindle, gear (e.g., Z=12), or other mechanical linkage, as would be understood by one of ordinary skill in the art. Motor 1580 can be communicatively coupled to one or both of processors 210, 302 (see, e.g., FIGS. 2-3) and may be automatically and/or dynamically controlled (e.g., based on contextual usage as discussed above with respect to FIGS. 1-13). For example, a mode of operation (e.g., ratchet mode or resistance mode) and a corresponding intensity can be set for MRS 1500 by controlling lever 1540 via lever gear 1570 and linkage 1582. The intensity may include how much or how little of the underlying effect (e.g., ratchet or resistance mode) is applied. MRS 1500 may be controlled by a host computer system 300, input device system 200, or a combination thereof (see, e.g., method 2400 of FIG. 24). Further, some embodiments may include a switch (not shown) that can be actuated when the knob is depressed, as discussed above at least with respect to FIG. 4A.

The various embodiments depicted herein show a particular arrangement of components (e.g., shaft, wheel, perimeters, etc.) that can be in axial alignment along an axis, and a motor, gear assembly, and lever extending laterally and substantially normal to the axis. Any arrangement of components can be used as would be understood by one of ordinary skill in the art. In some cases, wheel 1530 may be comprised of two separate wheels for each of perimeter 1535, 1537 separated by a distance (e.g., 0.25 cm) along knob shaft ("shaft") 1520, in contact with each other, or combined in a common wheel with both a toothed perimeter and a smooth perimeter, as shown in FIG. 15.

FIGS. 16A-20 show the various individual components of MRS 1500 and are accompanied with a more detailed analysis of those features. It should be understood that MRS 1500 is an exemplary embodiment, however changes and/or alternative embodiments may be employed for some or all of these features.

FIG. 16A shows aspects of a knob assembly for MRS 1500, according to certain embodiments. The knob assembly includes knob housing 1510 that is rotatable along an axis, and shaft 1520 coupled to knob housing 1510 and extending therefrom along the axis. Wheel 1530 may be axially coupled to shaft 1520 and can include a toothed perimeter 1535 and a smooth perimeter 1537. That is, toothed perimeter 1535 and smooth perimeter 1537 may share a common body. The surface of smooth perimeter 1537 is shown to protrude from wheel 1530, however some embodiments may have a smooth perimeter surface that is flush with the body of wheel 1530. In some embodiments, toothed perimeter 1535 and smooth perimeter 1537 may be on separate wheels, as shown in FIG. 16B. That is, some implementations may include a first wheel ("ratchet wheel") with a toothed perimeter and a second wheel ("resistance wheel") with a smooth perimeter, where both the first and second wheels are rotatable on the axis in correspondence with a rotation of the knob housing. Referring to FIG. 16, both toothed perimeter 1535 and smooth perimeter 1537 reside on a common body (wheel 1530). In some embodiments, the knob assembly may be depressible to actuate an actuator (e.g., a switch) for a push button effect, as shown as described above with respect to FIG. 4A. In some cases, toothed perimeter 1535 may include a low friction material, such as DuPont Delrin or other material with similar low-friction properties, and smooth perimeter 1537 may include a high friction material such as a thermoplastic elastomer (TPE), or other suitable compound with similar high friction properties. In certain implementations, smooth perimeter 1537 may be smooth with little to no imperfections on the surface, or it may be rough, knurled, dimpled, textured, or the like. Smooth perimeter 1537 may, in fact, be a rough surface. Generally stated, smooth perimeter 1537 can have any suitable surface texture, while maintaining a substantially even surface such that second end 1557 applies an even friction as smooth perimeter 1537 rotates. One of ordinary skill in the art would understand the many variations, modifications, and alternative embodiments thereof.

FIG. 16B shows aspects of an alternative knob assembly for MRS 1500, according to certain embodiments. The knob assembly includes knob housing 1510 that is rotatable along an axis, and shaft 1520 coupled to knob housing 1510 and extending therefrom along the axis. Ratchet wheel 1532 may be axially coupled to shaft 1520 and can include a toothed perimeter 1535. Resistance wheel 1534 may be axially coupled to shaft 1520 and can include a smooth perimeter 1537. The knob assembly of FIG. 16B may function similarly to the knob assembly of FIG. 16A, with no significant operational differences. FIG. 16B shows how certain embodiments may utilize separate wheels 1532, 1534, instead of a common wheel 1530 with two perimeters 1535, 1537 that share a common body, as shown in FIG. 16A.

Figure 17:
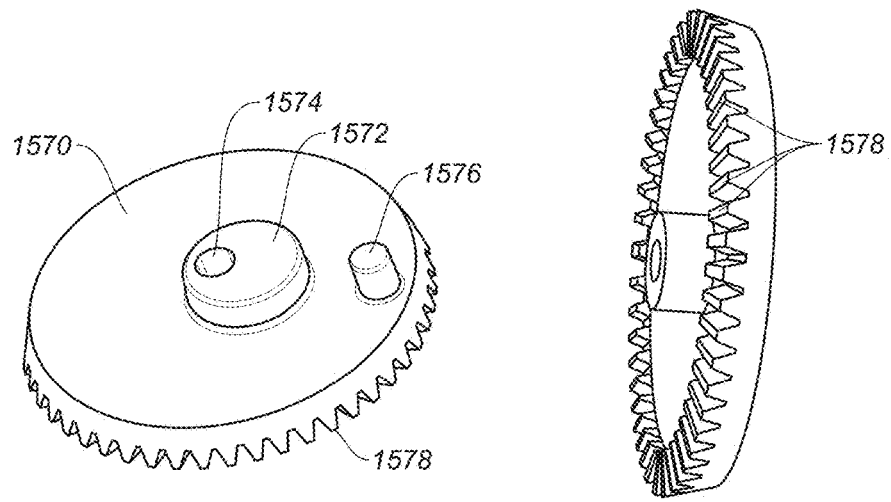
FIG. 17 shows lever gear for a mechanical ratchet system, according to certain embodiments.

FIG. 17 shows lever gear 1570 for MRS 1500, according to certain embodiments. Lever gear 1570 can include eccentric cam 1572, center hole 1574, stop ("protrusion") 1576, and gear teeth 1578. Lever gear 1570 is driven by processor-controlled electric motor 1580 via a spindle and smaller gear assembly (further discussed below) and is rotatable on an axis defined by center hole 1574. Lever gear 1570 rotates on a pin or axle (see pin 1592 of cover 1590) disposed in center hole 1574. Stop 1576 may function to limit the rotation of lever gear 1570. Stop 1576 may be referred to as a "protrusion." In some embodiments, lever gear 1570, when assembled in MRS 1500, can be limited to 180 degrees of rotation that may be controlled by the location of stop 1576, as will be further discussed below with respect to FIGS. 21-24. Eccentric cam 1572 protrudes from a surfaced of lever gear 1570 and is disposed off-center of center hole 1574. Eccentric cam 1572 can couple to lever 1540 via cam aperture 1542. The off-center placement of eccentric cam 1572 operates to cause lever 1540 to move between a first position and a second position that affect how biasing mechanism 1550 engages wheel 1530. Gear teeth 1578 are shown with a specific number of gear teeth (e.g., gear with M=0.3, Z=48), however any suitable gearing system can be used that can move lever 1540 at least from the first position to the second position, as would be understood by one of ordinary skill in the art.

Figure 18:
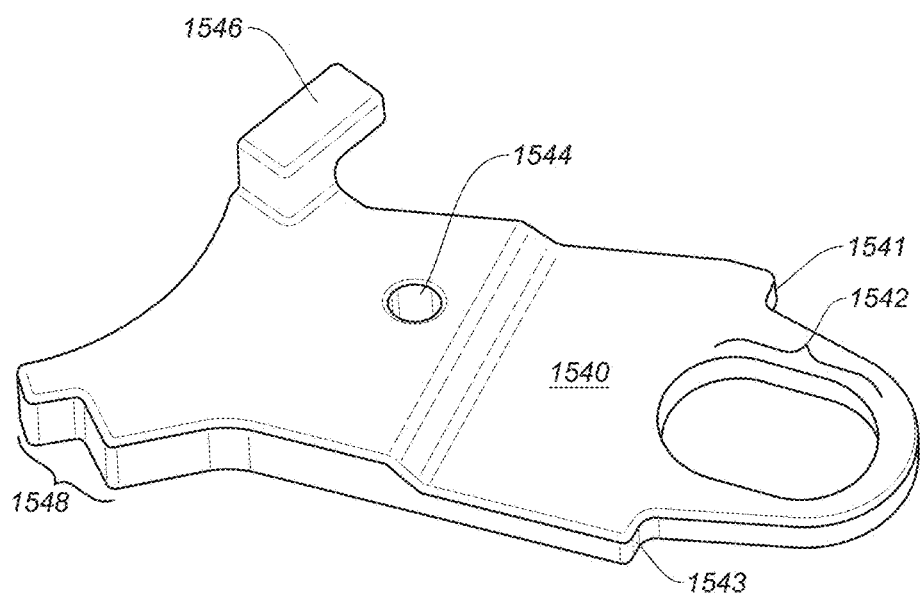
FIG. 18 shows a lever for a mechanical ratchet system, according to certain embodiments.

FIG. 18 shows lever 1540 for MRS 1500, according to certain embodiments. Lever 1540 may include pivot hole 1544, cam aperture 1542, first lever interface 1546, second lever interface 1548, brake 1541, and brake 1543. Cam aperture 1542 can be configured to receive eccentric cam 1572 of lever gear 1570, as shown, e.g., in FIGS. 15 and 21. Brake 1541 and brake 1543 may define a range of movement of stop 1576 of lever gear 1570. Pivot hole 1544 may receive pin ("axle") 1594 of cover 1590, which can allow lever 1540 to rotate with respect to pin 1594 over a range defined by the location of brakes 1541, 1543, as further discussed below. In some embodiments, brakes 1541, 1543 may be located in different locations on lever 1540 to allow greater or lesser range of rotation of lever 1540, which can change an amount of force provided lever 1540 on biasing mechanism 1550. In some cases, allowing lever 1540 to provide a wide range of forces on biasing mechanism 1550 can yield a greater range of modulation of an intensity of the ratcheting and resistance effect, as further discussed below, as least with respect to FIGS. 21-24.

Figure 19:
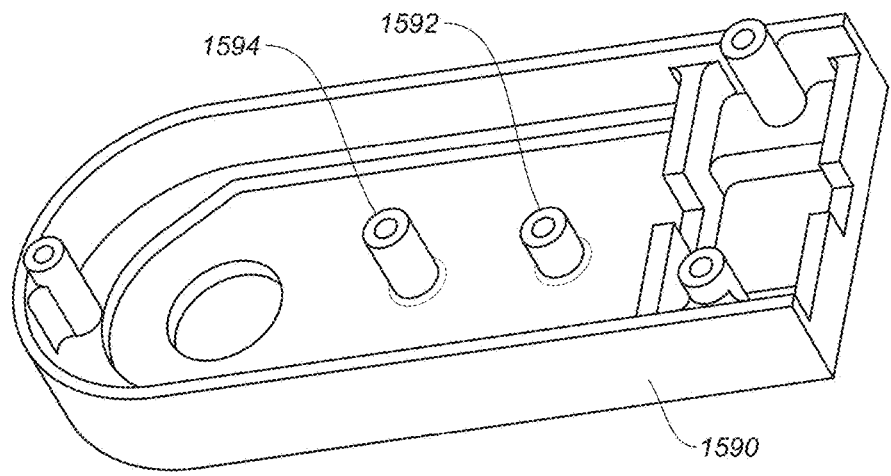
FIG. 19 shows a housing for a mechanical ratchet system, according to certain embodiments.
Figure 22:
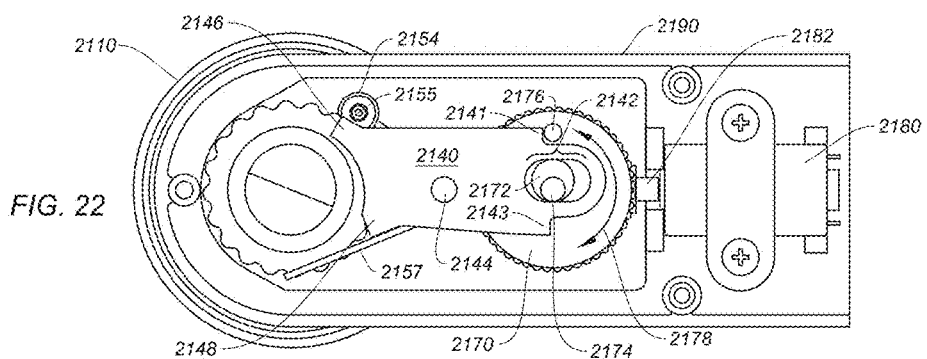
FIG. 22 shows a bottom view of a mechanical ratchet system for a knob configured in a ratchet-mode of operation, according to certain embodiments.
Figure 23:
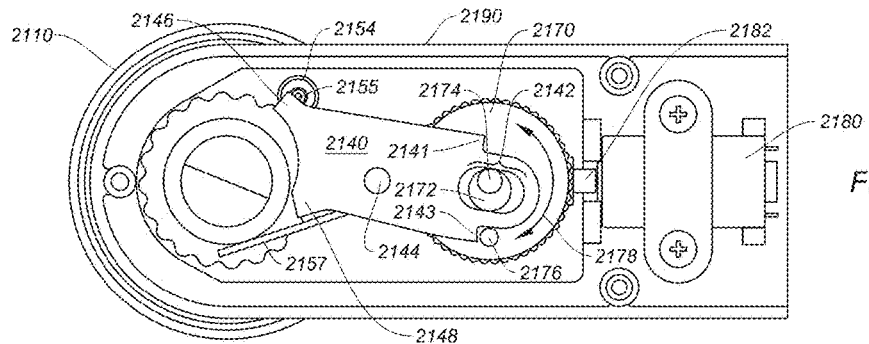
FIG. 23 shows a bottom view of a mechanical ratchet system for a knob configured in a resistance-mode of operation, according to certain embodiments.

FIG. 19 shows a cover ("housing") 1590 for MRS 1500, according to certain embodiments. Cover 1590 may house and secure many of the components of MRS 1500, as shown in FIGS. 22-23. Cover 1590 may include pin 1592 and pin 1594. Pin 1592 can be configured to fit inside center hole 1574 to provide an axis of rotation for lever gear 1570. Pin 1594 can be configured to fit inside pivot hole 1544 to provide an axis of rotation for lever 1540. Cover 1590 is shown with a particular shape and set of fastening locations. One of ordinary skill in the art would understand the many variations, modifications, and alternative embodiments thereof.

Figure 20:
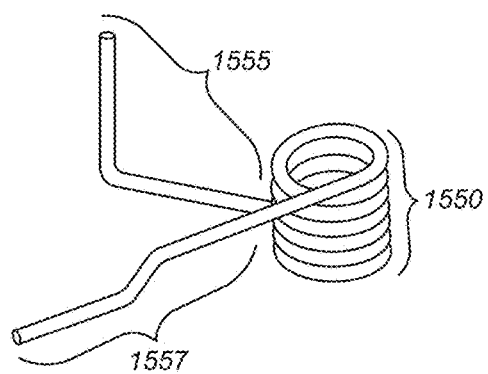
FIG. 20 shows a biasing mechanism for a mechanical ratchet system, according to certain embodiments.

FIG. 20 shows biasing mechanism 1550 for MRS 1500, according to certain embodiments. Biasing mechanism 1550 can include first end 1555 and second end 1557. In some embodiments, biasing mechanism 1550 can be a helicoidal torsion spring, or other suitable element that can produce a force in a similar manner. Although first end 1555 and second end 1557 are shown at an angle with respect to each other, they can be approximately parallel when biasing mechanism 1550 is at rest (i.e., no deformation or outside forces acting on it). Biasing mechanism 1550 can be pried apart when installed in MRS 1500 to provide a restoring force, which may be used to cause first end 1555 (and roller 1554) to engage toothed perimeter 1535 and/or second end 1557 to engage smooth perimeter 1537. In some embodiments, biasing mechanism 1550 may be moved to engage toothed perimeter 1535 or smooth perimeter 1537 via first lever interface 1546 and second lever interface 1548, as further discussed below.

Figure 21:
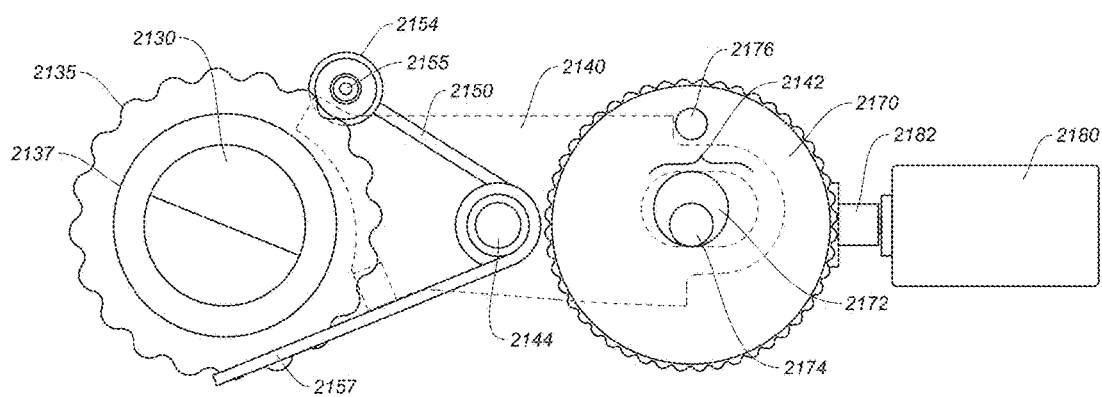
FIG. 21 shows a mechanical ratchet system for an input device, according to certain embodiments.

FIG. 21 is a mechanical ratchet system (MRS) 2100 for an input device, according to certain embodiments. MRS 2100 can be similar to MRS 1500 and is provided herein as reference for understanding the operation of MRS 2100 when placed in the ratchet and resistance modes of operation, as explained in the examples that follow (see, e.g., FIGS. 22-24). MRS 2100 can include electric motor ("motor") 2180 that includes a spindle and gear mechanism ("linkage") 2182 that may couple to and drive lever gear 2170 via gear teeth 2178. Motor 2180 can be communicatively coupled to one or both of processors 210, 302 (see, e.g., FIGS. 2-3) and may be automatically and/or dynamically controlled based on contextual usage, as discussed above with respect to FIGS. 1-13.

Lever gear 2170 may include can include eccentric cam 2172, center hole 2174, stop 2176, and gear teeth 2178. Lever gear 2170 can be coupled to lever 2140, which is shown in a transparent representation to expose lever gear 2170 and biasing mechanism 2150 that may otherwise be obscured from view. In some embodiments, lever 2140 may include pivot hole 2144, cam aperture 2142, first lever interface 2146, second lever interface 2148, brake 2141, and brake 2143. Brake 2141 and 2143 may be referred to as a "stop contacts.". Lever 2140 may rotate on an axis defined by pivot hole 2144 and over a range defined by stop 2176 and brakes 2141, 2143. In some cases, lever 2140 may be moved by eccentric cam 2172 via cam aperture 2142. The non-centered (eccentric) position of eccentric cam 2172 causes a non-even rotation which pushes lever 2140 between at least a first position and a second position, as further discussed below. In some implementations, lever 2140 may control biasing mechanism 2150 at first end 2155 via first lever interface 2146, and second end 2157 via second lever interface 2148. Biasing mechanism 2150 may interface wheel 2130 based on a position of lever 2140. For instance, when lever 2140 is in a first position, second end 2157 may be disengaged from smooth perimeter 2137, leaving roller 2154 of first end 2155 (i.e., biasing mechanism 2150) in contact with toothed perimeter 2135, which may generate a ratcheted rotation as knob housing 2110 is rotated. Similarly, when lever 2140 is in a second position, first end 2155 and corresponding roller 2154 may be disengaged from toothed perimeter 2135, leaving second end 2157 in contact with smooth perimeter 2137, which generates a frictional rotation as knob housing 2110 rotates.

In some alternative embodiments, MRS 2100 may not have roller 2154 and may be configured such that first end 2155 interfaces with toothed perimeter 2135. MRS 1500 may be controlled by a host computer system 300, input device system 200, or a combination thereof (see, e.g., method 2400 of FIG. 24). Further, some embodiments may include a switch (not shown) that can be actuated when the knob is depressed, as discussed above at least with respect to FIG. 4A.

Ratchet and Resistance Modes of Operation Using the Mechanical Ratchet System

The ratchet mode of operation, as discussed above, causes a knob (e.g., knob 450) to rotate in a ratcheted manner over a number of discrete positions, as further discussed above with respect to FIG. 10. In some embodiments, the ratcheted rotation can vary depending on how much force is applied by the biasing mechanism (e.g., restoring force) and/or the lever, which can reduce the overall force and affect the intensity of the ratcheting or resistance effect. In some embodiments, the biasing mechanism may be normally (i.e., by default) engaged with the toothed perimeter and/or smooth perimeter. Thus, both a ratcheted and frictional (resistance) rotation may be applied and an external force (e.g., via a lever) acts to disengage one end of the biasing mechanism, thus leaving the selected effect (e.g., ratcheted rotation) and removing the non-selected effect (e.g., frictional rotation). Some alternative embodiments may utilize a normally disengaged configuration where the biasing mechanism is normally (i.e., by default) disengaged from the toothed/smooth perimeters, which could be engaged when a lever assembly pushes (i.e., provides a force) the biasing mechanism to cause them to be coupled. One of ordinary skill in the art with the benefit of this disclosure would understand the many variations, modifications, and alternative embodiments thereof.

FIG. 22 shows a bottom view of a mechanical ratchet system ("MRS") 2200 for a knob configured in a ratchet-mode of operation, according to certain embodiments. MRS 2200 can be similar to MRS 2100 and utilizes the same part numbers for the example that follows. In operation, when MRS 2100 enters the ratchet-mode of operation, roller 2154 of first end 2155 engages toothed perimeter 2135, and second end 2157 disengages with smooth perimeter 2137, resulting in a ratcheted rotation of knob housing 2110. To place MRS 2200 in the ratchet mode of operation, electric motor 2180 (e.g., controlled by processor 210 and/or 302, as discussed above with respect to FIGS. 1-13) may rotate lever gear 2140 counter-clockwise until stop ("protrusion") 2176 contacts brake 2141 of lever 2140. In this position ("position 1"), lever 2140 may not rotate any further past stop 2176, and eccentric cam 2172 may be skewed toward stop 2176. Thus, in position 1, lever 2140 may decouple from (or not couple to) biasing mechanism 2150 at roller 2154/first end 2155, and couple to and provide a force to second end 2157 of biasing mechanism 2150 causing it to disengage from smooth perimeter 2137, which thereby leaves only the ratcheted rotation effect in play, as shown in FIG. 22.

In the present example, lever 2140 does not contact first end 2155 while MRS 2200 is in the ratchet mode of operation. In some alternative embodiments, lever 2140 may contact and provide a force to first end 2155 while in the ratchet mode of operation (e.g., position 1), which may push first end 2155 away from toothed perimeter 2135 enough to reduce the amount of restoring force provided by biasing mechanism 2150, but not enough to disengage first end 2155. Thus, an intensity of the ratcheting effect can be adjusted (e.g., reduced) based on the amount of force pushing first end 2155 away from toothed perimeter 2135.

FIG. 23 shows a bottom view of MRS 2300 for a knob configured in a resistance-mode of operation, according to certain embodiments. MRS 2300 can be similar to MRS 2100 and utilizes the same part numbers for the example that follows. In operation, when MRS 2300 enters the resistance-mode of operation, second end 2157 engages smooth perimeter 2137, and first end 2155 disengages with toothed perimeter 2135, resulting in a frictional rotation of knob housing 2110. To place MRS 2300 in the resistance mode of operation, motor 2180 (e.g., controlled by processor 210 and/or 302) may rotate lever gear 2140 clockwise until stop 2176 contacts brake 2143 of lever 2140. In this position ("position 2"), lever 2140 may not rotate any further and eccentric cam 2172 may be skewed toward stop 2176. Thus, in position 2, lever 2140 may decouple from (or not couple to) biasing mechanism 2150 at second end 2157, and couple to and provide a force to first end 2155 of biasing mechanism 2150, causing it to disengage from toothed perimeter 2135, leaving the frictional rotation effect in play, as shown in FIG. 23.

In this example, lever 2140 does not contact second end 2157 while MRS 2300 is in the resistance mode of operation. In some alternative embodiments, lever 2140 may contact and provide a force to second end 2157 while in the resistance mode of operation (e.g., position 2), which may push second end 2157 away from smooth perimeter 2137 enough to reduce the amount of restoring force provided by biasing mechanism 2150, but not enough to disengage second end 2157. Thus, an intensity of the resistance effect can be adjusted (e.g., reduced) based on the amount of force pushing second end 2157 away from smooth perimeter 2137.

Figure 24:
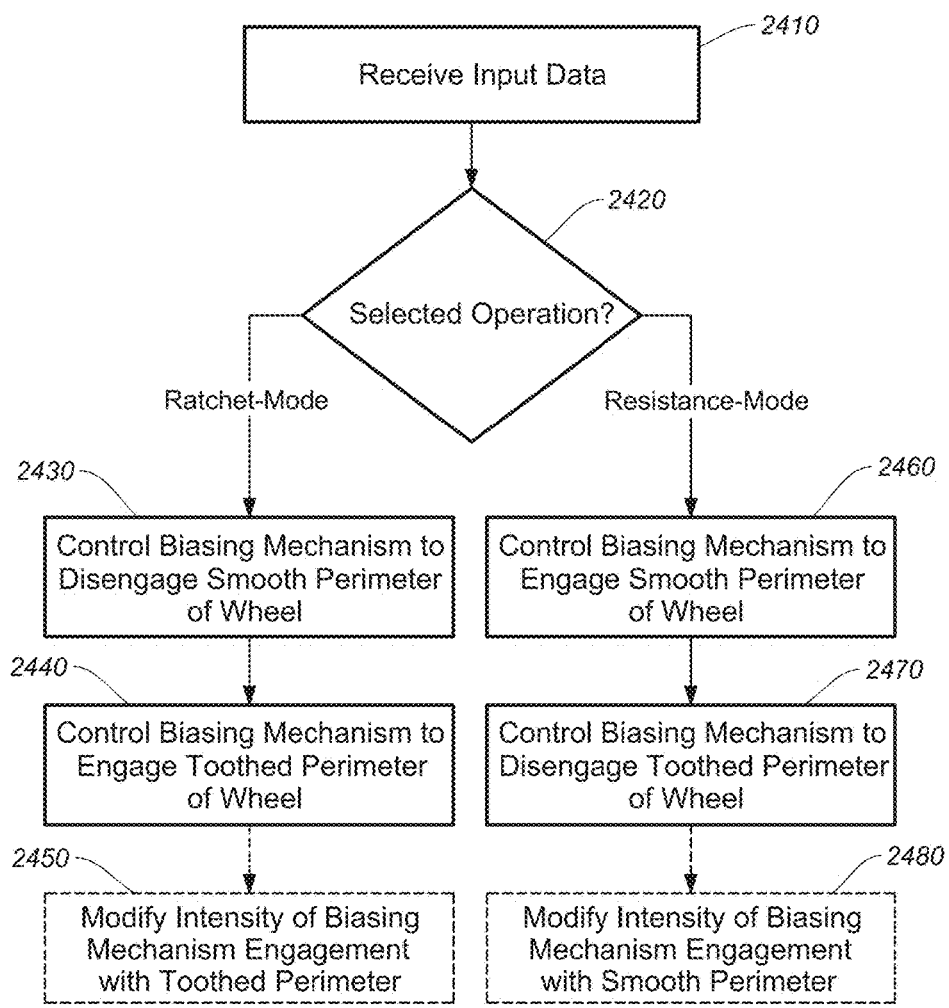
FIG. 24 shows a simplified flow diagram for controlling a mechanical ratchet system, according to certain embodiments.

FIG. 24 shows a simplified flow diagram for a method 2400 for controlling a mechanical ratchet system (e.g., MRS 2200/2300), according to certain embodiments. Method 2400 can be performed by processing logic (e.g., a computer-implemented method) that may comprise hardware (circuitry, dedicated logic, etc.), software operating on appropriate hardware (such as a general purpose computing system or a dedicated machine), firmware (embedded software), or any combination thereof. In certain embodiments, method 2400 can be performed by processor 210 of system 200, processor 302 of system 300, or a combination thereof, as shown and described above with respect to FIGS. 2-3. MRS 2200/2300 is referenced for the purpose of explaining aspects of the invention. However, method 2400 is not limited to any particular embodiment explicitly or tacitly described herein.

In some embodiments, first and second ends 2155, 2157 may be normally engaged (i.e., by default) such that when biasing mechanism 2150 (e.g., a helicoidal torsion spring) is not manipulated by lever 2140, biasing mechanism 2150 provides a force on toothed perimeter 2135 and smooth perimeter 2137 of wheel 2130. More specifically, first end 2155 may engage with toothed perimeter 2135 and second end may engage with smooth perimeter 2137 to provide both a ratcheted and frictional resistance when the knob housing is rotated. In alternative embodiments, biasing mechanism 2150 may be normally disengaged with wheel 2130.

At step 2410, method 2400 can include receiving input data, according to certain embodiments. The input data may correspond to a selection of one of a ratchet mode of operation for the knob (450), or a resistance-mode of operation for the knob (step 2420), as further discussed above at least with respect to FIGS. 8-10. In one non-limiting example, processor 210 may receive control data from a host computer including data corresponding to a contextual usage of a cursor on a screen. The control data may indicate a corresponding mode of operation, or processor 210 may select a mode of operation based on the control data. One of ordinary skill in the art would understand the many variations, modifications, and alternative embodiments thereof.

At step 2430, when the selection corresponds to the ratchet-mode of operation, method 2400 may include controlling second end 2157 of biasing mechanism 2150 to disengage with smooth perimeter 2137 of wheel 2130 that is axially coupled to knob housing 2110. At step 2440, method 2400 may further include controlling first end 2155 of biasing mechanism 2150 to engage with toothed perimeter 2135 of wheel 2130 to provide a ratcheted rotation when the knob is rotated. As indicated above, some embodiments may have first/second ends engaged to their corresponding perimeters by default. In such cases, no interaction with first end via the lever may be needed for the ratchet mode, and no interaction with first end via the lever may be needed for the resistance mode, as would be understood by one of ordinary skill in the art with the benefit of this disclosure. In some cases, when the input data corresponds to the selection of the ratchet-mode of operation, method 2400 may include moving lever 2140 to a second position (e.g., via motor 2180) to cause first end 2155 of biasing mechanism 2150 to disengage with toothed perimeter 2135 of wheel 2130.

In some cases, the input data further can further include intensity data, as further described above. Thus, at optional step 2450, method 2400 can include modifying an intensity of the ratcheted rotation based on the intensity data. In some cases, modifying the intensity of the ratcheted rotation may include controlling (e.g., reducing or increasing) an amount of force provided by first end 2155 on toothed perimeter 2135 to change a strength of the ratcheting effect, as discussed above with respect to FIG. 14-15.

At step 2460, when the selection corresponds to the resistance-mode of operation, method 2400 may include controlling first end 2155 of biasing mechanism 2150 to disengage with toothed perimeter 2135 of wheel 2130 that is axially coupled to knob housing 2110. At step 2470, method 2400 may further include controlling second end 2157 of biasing mechanism 2150 to engage with smooth perimeter 2137 of wheel 2130 to provide a frictional resistance to rotation when the knob is rotated. In some embodiments, steps 2460 and 2470 may further include moving lever 2140 to a first position (e.g., via motor 2180) to cause second end 2157 of the biasing mechanism to disengage with smooth perimeter 2137 of wheel 2130.

At optional step 2480, method 2400 can include modifying an intensity of the frictional rotation based on the intensity data. In some cases, modifying the intensity of the frictional rotation may include controlling (e.g., reducing or increasing) an amount of force provided by second end 2157 on smooth perimeter 2137 to change a strength of the frictional effect, as discussed above with respect to FIG. 14-15.

It should be appreciated that the specific steps illustrated in FIG. 24 provide a particular method 2400 for controlling a mechanical ratchet system, according to certain embodiments. Other sequences of steps may also be performed according to alternative embodiments. For example, alternative embodiments may perform the steps outlined above in a different order. Moreover, the individual steps illustrated in FIG. 24 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of method 2400.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the embodiments, alternative embodiments, etc., and the concepts thereof may be applied to any other embodiments described and/or within the spirit and scope of the disclosure.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

What is claimed is:

1. A knob for an input device, the knob comprising:
   a knob housing being rotatable on an axis;
   a shaft coupled to and extending from the knob housing along the axis;
   a ratchet wheel axially coupled to the shaft and including a toothed perimeter;
   a resistance wheel axially coupled to the shaft and including a smooth perimeter,
      wherein the ratchet wheel and the resistance wheel are rotatable on the axis in correspondence with a rotation of the knob housing; and
   a biasing mechanism including:
      a first end coupled to a roller, wherein the biasing mechanism provides a first force causing the roller on the first end to engage with the toothed perimeter of the ratchet wheel such that a ratcheted rotation occurs when the knob housing is rotated; and a second end, wherein the biasing mechanism provides a second force causing the second end to engage with the smooth perimeter of the resistance wheel such that a friction is provided when the knob housing is rotated.

2. The knob of claim 1 further comprising:
a lever coupled to the biasing mechanism, the lever to switch between a first position and a second position,
wherein when in the first position, the lever causes the second end of the biasing mechanism to disengage with the resistance wheel, and
wherein when in the second position, the lever causes the roller on the first end of the biasing mechanism to disengage with the ratchet wheel.

3. The knob of claim 2 further comprising:
a gear system coupled to the lever;
a processor; and
an electric motor controlled by the processor and coupled to the gear system to cause the lever to switch between the first position and the second position.

4. The knob of claim 3 wherein the gear system includes a protrusion that stops the lever from rotating past the first position and the second position.

5. The knob of claim 1 further comprising:
a switch disposed below and substantially in axial alignment with the shaft,
wherein the knob is depressible, and
wherein the switch is activated when the knob is depressed.

6. The knob of claim 1 wherein the biasing mechanism is a helicoidal spring.

7. The knob of claim 1 wherein the toothed perimeter of the ratchet wheel includes a low friction material, and wherein the smooth perimeter of the resistance wheel includes a high friction material.

8. The knob of claim 1 wherein the ratchet wheel and the resistance wheel share a common body.

9. The knob of claim 1 wherein the first and second forces provided by the biasing mechanism are adjustable and controlled by a processor.

10. The knob of claim 9 wherein the first force causing the roller on the first end to engage with the toothed perimeter of the ratchet wheel is adjustable by the processor to vary an intensity of the ratcheted rotation, and
wherein the second force causing the second end to engage with the resistance wheel is adjustable by the processor to vary an intensity of the friction.

11. A computer-implemented method for the operation of a knob on an input device, the method comprising:
receiving input data, by a processor, corresponding to a selection of one of a:
ratchet-mode of operation for the knob; and
a resistance-mode of operation for the knob,
when the input data corresponds to the selection of the resistance-mode of operation:
controlling, by the processor, a first end of a biasing mechanism to disengage with a toothed perimeter of a wheel that is axially coupled to a shaft extending from the knob; and
controlling, by the processor, a second end of the biasing mechanism to engage with a smooth perimeter of the wheel, the second end configured to provide a frictional resistance to rotation when the knob is rotated; and when the input data corresponds to the selection of the ratchet-mode of operation:
controlling, by the processor, the first end of a biasing mechanism to engage with the toothed perimeter of the wheel, the first end configured to provide a ratcheted rotation when the knob is rotated; and
controlling, by the processor, the second end of the biasing mechanism to disengage with the smooth perimeter of the wheel.

12. The computer-implemented method of claim 11 wherein a lever controls the first end and second end of the biasing mechanism, the method further comprising:
when the input data corresponds to the selection of the resistance-mode of operation: moving the lever to a first position to cause the second end of the biasing mechanism to disengage with the smooth perimeter of the wheel; and
when the input data corresponds to the selection of the ratchet-mode of operation: moving the lever to a second position to cause the first end of the biasing mechanism to disengage with the toothed perimeter of the wheel.

13. The computer-implemented method of claim 12 wherein an electric motor controls the moving the lever to the first position and the moving the lever to the second position.

14. The computer-implemented method of claim 11 wherein the biasing mechanism is a helicoidal spring.

15. The computer-implemented method of claim 11 wherein the toothed perimeter of the wheel includes a low friction material, and wherein the smooth perimeter of the wheel includes a high friction material.

16. The computer-implemented method of claim 11 wherein the toothed perimeter and the smooth perimeter are on separate wheels and separated by the shaft.

17. The computer-implemented method of claim 11 wherein the input data further includes intensity data,
wherein when the input data corresponds to the ratchet-mode of operation: modifying an intensity of the ratcheted rotation based on the intensity data; and
wherein when the input data corresponds to the resistance-mode of operation: modifying an intensity of the frictional resistance to rotation based on the intensity data.

18. An apparatus comprising:
a knob housing being rotatable on an axis;
a shaft coupled to and extending from the knob housing along the axis;
a wheel axially coupled to the shaft and including:
a toothed perimeter; and
a smooth perimeter,
wherein the wheel is rotatable on the axis in correspondence with a rotation of the knob housing;
a wheel contacting interface including a first end and a second end, wherein the first end is coupled to a roller; and
a lever coupled to the wheel contacting interface, the lever configured to switch between a first position and a second position,
wherein when in the first position, the lever causes the roller on the first end to engage with the toothed perimeter of the wheel such that a ratcheted rotation occurs when the knob housing is rotated, and
wherein when in the second position, the lever causes the second end to engage with the smooth perimeter of the wheel such that a friction is provided when the knob housing is rotated.

19. The apparatus of claim 18 further comprising:
a gear system coupled to the lever;
a processor; and
an electric motor controlled by the processor and coupled to the gear system to cause the lever to switch between the first position and the second position.

20. The apparatus of claim 18 further comprising:
an actuator disposed below and substantially in axial alignment with the shaft,
wherein the knob is depressible, and
wherein the actuator is activated when the knob is depressed.

* * * * *